(12) United States Patent
Youn et al.

(10) Patent No.: US 8,885,386 B2
(45) Date of Patent: Nov. 11, 2014

(54) WRITE DRIVER IN SENSE AMPLIFIER FOR RESISTIVE TYPE MEMORY

(71) Applicants: YongSik Youn, Cupertino, CA (US); Sooho Cha, Seoul (KR); DongSeok Kang, hwasung-si (KR); Chan-kyung Kim, Hwaseong-si (KR)

(72) Inventors: YongSik Youn, Cupertino, CA (US); Sooho Cha, Seoul (KR); DongSeok Kang, hwasung-si (KR); Chan-kyung Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 91 days.

(21) Appl. No.: 13/659,882

(22) Filed: Oct. 24, 2012

(65) Prior Publication Data

US 2014/0112053 A1    Apr. 24, 2014

(51) Int. Cl.
*G11C 11/00* (2006.01)

(52) U.S. Cl.
USPC ............................. 365/148; 365/158; 365/205

(58) Field of Classification Search
CPC ........ G11C 7/06; G11C 7/22; G11C 11/4091; G11C 11/4097; G11C 11/16; G11C 13/0069; G11C 13/0004
USPC .................. 365/148, 158, 191, 194, 205, 207
See application file for complete search history.

(56) References Cited

U.S. PATENT DOCUMENTS

| | | | |
|---|---|---|---|
| 6,687,175 B1 * | 2/2004 | Mizuno et al. | 365/203 |
| 7,366,003 B2 * | 4/2008 | Hush et al. | 365/100 |
| 7,764,536 B2 | 7/2010 | Luo et al. | |
| 7,869,249 B2 * | 1/2011 | Hush et al. | 365/100 |
| 2009/0027984 A1 * | 1/2009 | Mizuno et al. | 365/203 |
| 2013/0155755 A1 * | 6/2013 | Park et al. | 365/148 |

* cited by examiner

*Primary Examiner* — Gene Auduong
(74) *Attorney, Agent, or Firm* — Renaissance IP Law Group LLP

(57) ABSTRACT

Example embodiments include a level shifting write driver in a sense amplifier for a resistive type memory. The write driver may include a cross-coupled latch circuit, a first output section, a second output section, and an input section. The first output section includes one or more first driving transistors to drive a first current through the first output section and not through the cross-coupled latch. The second output section includes one or more second driving transistors configured to drive a second current through the second output section and not through the cross-coupled latch. The current flows of the outputs sections are isolated from the latch circuit. In some embodiments, no two PMOS type transistors are serially connected, thereby reducing the consumption of die area. In some embodiments, a single control signal is used to operate the write driver.

18 Claims, 18 Drawing Sheets

| Write Driver | | | Typical ← FIGs. 1A and 1B | | Latched ← FIGs. 6A and 6B | | Two stage ← FIGs. 8, 9A and 9B | |
|---|---|---|---|---|---|---|---|---|
| | | Type | A | B | A | B | A | B |
| Relative size ratio for bidirectional balanced output drivability | CMOS Driver | P0 | 4 | 4 | 4 | 4 | | |
| | | P1 \| P2 | 4 \| 4 | 16* \| 16* | 4 \| 4 | 4 \| 4 | 2^ \| 2^ | 2^ \| 2^ |
| | | P3 \| P4 | | | | 1 | 1 \| 1 | 1 \| 1 |
| | | P5 \| P6 | | | | | 1 \| 1 | 1 \| 1 |
| PMOS needs double size of NMOS | | P9 or N9 | | | 1 | 1 | | |
| | | N7 \| N8 | | | | | 1 \| 1 | 1 \| 1 |
| | | N5 \| N6 | | | | | 1 \| 1 | 1 \| 1 |
| Area | | N3 \| N4 | | | 1 \| 1 | 1 \| 1 | 2 \| 2 | 2 \| 2 |
| *Four times bigger size from half the gate drive voltage | | N1 \| N2 | 8* \| 2 | 16* \| 2 | 2 \| 2 | 2 \| 2 | 2 \| 2 | 2 \| 2 |
| | | N0 | 2 | 2 | 2 | 2 | 1 | 1 |
| ^ Half size due to non-stacked PMOS | Inverter | MP & MN | | | 1 \| 1 | 1 \| 1 | | |
| | Total | | 30 | 42 | 23 | 23 | 19 | 21 |
| Control logic signal | | | 2 with time delay logic | | 2 with time delay logic | | 1 | |
| Available write time | | | In between | | Reduced range | | Full range | |
| Overall | | | Worse | | Good | | Better | |

FIG. 11

WRITE DRIVER IN SENSE AMPLIFIER FOR RESISTIVE TYPE MEMORY

BACKGROUND

The present inventive concepts relate to sense amplifiers for resistive type memory circuits, and more particularly to a write driver in a sense amplifier for resistive type memory.

Resistive type memories encompass a new generation of non-volatile memory and are expected to become more prevalent in the marketplace. Resistive type memories can include, for example, spin transfer torque (STT) magnetoresistive random-access memory (MRAM), MRAM (of the non-STT variety), memristor RAM, ReRAM, CBRAM, and the like.

FIG. 1A is a circuit diagram of a typical write driver 105 in a sense amplifier for resistive type memory circuits. Referring to FIG. 1A, a latch circuit is configured by PMOS type transistors P1 and P2. NMOS type transistors N1 and N2 are driving transistors, which are larger in size (e.g., 2× larger) than the transistors P1 and P2 to provide sufficient drivability. Differential input terminals (i.e., In− and In+) are coupled to the gates of the driving transistors N1 and N2, respectively. An input voltage can have a one-half voltage swing, or in other words, the input voltage can range between the voltage potential VSS and ground potential GND, where GND is one half of the difference between VDD and VSS. However, where a one-half voltage swing on the input is used, the NMOS type transistors N1 and N2 must be significantly larger, taking up more die area. In cases where the write driver of FIG. 1A receives a full voltage swing on the input (i.e., between VDD and VSS), there still remains a stacked PMOS configuration (i.e., P0-P1 and P0-P2), which also significantly increases the consumption of die area. An output voltage fully swings between VSS and VDD.

A control signal WRa is delayed by the delay circuit 115 to produce the delayed control signal WRd. In an initial state, the control signal WRa is not asserted or is otherwise LOW and WRd is asserted or is otherwise HIGH. In the initial state, the output voltage level is undefined because the switch transistors P0 and N0 are off, which causes the latch transistors P1 and P2 and the driving transistors N1 and N2 to be in an undefined or dangling condition. In response to the control signal WRa being asserted or otherwise being set to HIGH, the control signal WRd is not asserted or is otherwise set to LOW after the delay. Depending on the voltage levels at the differential input terminals In− and In+, the latch circuit will latch, based on positive feedback, either a logical high value (e.g., '1') or a logical low value (e.g., '0') at the differential output terminals Out+ and Out−, respectively.

FIG. 1B is a circuit diagram of another typical write driver 110 in a sense amplifier for resistive type memory circuits. The write driver 110 is similar to that of the write driver 105, with a few notable differences. The latch circuit is configured by NMOS type transistors N1 and N2. PMOS type transistors P1 and P2 are driving transistors, which are larger in size (e.g., 8× larger) than the transistors N1 and N2 to provide sufficient drivability. The differential input terminals (e.g., In− and In+) are coupled to the gates of the driving transistors P1 and P2, respectively. An input voltage can have a one-half voltage swing, or in other words, the input voltage can range between the voltage potential VDD and ground potential GND, where GND is one half of the difference between VDD and VSS. However, where a one-half voltage swing on the input is used, the PMOS type transistors P1 and P2 must be significantly larger, taking up more die area. Similar to the Writer A of FIG. 1A, in cases where the write driver of FIG. 1B receives a full voltage swing on the input (i.e., between VDD and VSS), there still remains a stacked PMOS configuration (i.e., P0-P1 and P0-P2), which also significantly increases the consumption of die area. An output voltage fully swings between VSS and VDD.

A control signal WRb is delayed by the delay circuit 120 to produce the delayed control signal WRc. In an initial state, the control signal WRb is asserted or is otherwise HIGH and WRc is not asserted or is otherwise LOW. In the initial state, the output voltage level is undefined because the switch transistors P0 and N0 are off, which causes the latch transistors N1 and N2 and the driving transistors P1 and P2 to be in an undefined or dangling condition. In response to the control signal WRb not being asserted or otherwise being set to LOW, the control signal WRc is asserted or is otherwise set to HIGH after the delay. Similar to the write driver 105, depending on the voltage levels at the differential input terminals In− and In+, the latch circuit will latch, based on positive feedback, either a logical high value (e.g., '1') or a logical low value (e.g., '0') at the differential output terminals Out+ and Out−, respectively.

Because of fundamental characteristics of CMOS logic, certain circuit configurations require extensive die area, which increases the cost of the overall circuit. For example, a PMOS type transistor needs to be double the size relative to an NMOS type transistor to provide the same drivability. By way of another example, a stacked CMOS configuration where multiple transistors are serially connected requires that each transistor be four times the size relative to non-stacked transistors to achieve the same drivability. In addition, transistors receiving half of a gate voltage need to be four times the size relative to transistors receiving a full gate voltage to achieve the same drivability. Such characteristics cause the write drivers in sense amplifiers of the prior art to consume undesirable amounts of die area.

Accordingly, a need remains for improved write drivers, which consume less die area and use fewer control signals, and therefore, provide more compact and less expensive circuits.

BRIEF SUMMARY

According to one embodiment of the inventive concept, a level shifting write driver in a sense amplifier for a resistive type memory includes a cross-coupled latch including at least two latch transistors, a first output section including one or more first driving transistors coupled to a first differential output terminal, the one or more first driving transistors being configured to drive a first current through the first output section and not through the cross-coupled latch, and a second output section including one or more second driving transistors coupled to a second differential output terminal, the one or more second driving transistors being configured to drive a second current through the second output section and not through the cross-coupled latch.

The current flows of the outputs sections are isolated from the latch circuit. In some embodiments, no two PMOS type transistors are serially connected, thereby reducing the consumption of die area. In some embodiments, a single control signal is used to operate the write driver.

According to another example embodiment, a method for sensing and driving signals associated with a write driver in a sense amplifier for resistive type memory includes, in an initial state, charging first and second nodes of the write driver to a first voltage potential, receiving a control signal, pulling one of the first or second nodes from the first voltage potential to a second voltage potential responsive to the control signal and responsive to voltage levels of first or second differential input terminals, respectively, latching, by a latch circuit, the respective voltage potentials at the first and second nodes, driving, by one or more first driving transistors, a first current through a first output section, causing a voltage level of a first differential output terminal to be one of the first voltage potential or the second voltage potential responsive to the voltage potential at the first node and responsive to the driven first current, driving, by one or more second driving transistors, a second current through a second output section, and causing a voltage level of a second differential output terminal to be the other of the first voltage potential or the second voltage potential responsive to the voltage potential at the second node and responsive to the driven second current.

The foregoing and other features and advantages of the inventive concept will become more readily apparent from the following detailed description of the example embodiments, which proceeds with reference to the accompanying drawings.

BRIEF DESCRIPTION OF THE DRAWINGS

FIG. 11 is an example size ratio comparison matrix between a typical write driver and write drivers in accordance with embodiments of the inventive concept.

DETAILED DESCRIPTION

Reference will now be made in detail to embodiments of the inventive concept, examples of which are illustrated in the accompanying drawings. In the following detailed description, numerous specific details are set forth to enable a thorough understanding of the inventive concept. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first circuit could be termed a second circuit, and, similarly, a second circuit could be termed a first circuit, without departing from the scope of the inventive concept.

The terminology used in the description of the inventive concept herein is for the purpose of describing particular embodiments only and is not intended to be limiting of the inventive concept. As used in the description of the inventive concept and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Figure 2:
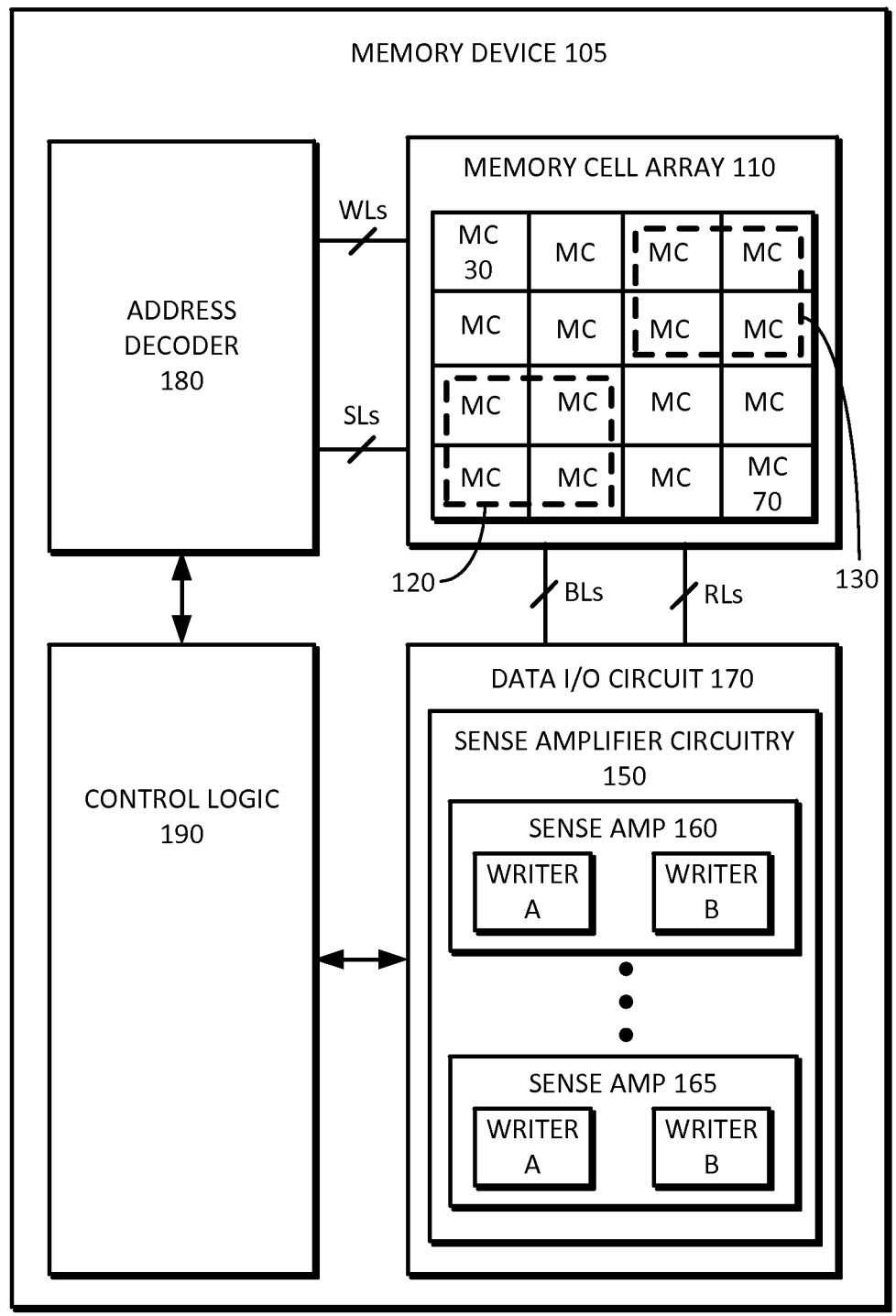
FIG. 2 is an example block diagram of a memory device including sense amplifier circuitry having write drivers, in accordance with embodiments of the inventive concept.

FIG. 2 is an example block diagram of a memory device 105 including sense amplifier circuitry 150, in accordance with embodiments of the inventive concept. Referring to FIG. 2, the memory device 105 includes a memory cell array 110, a data I/O circuit 170, an address decoder 180, and control logic 190. The data I/O circuit 170 may include the sense amplifier circuitry 150 for sensing or reading bit information stored in memory cell array 110. The sense amplifier circuitry 150 includes sense amplifiers (e.g., 160) having level shifting write drivers (e.g., Writer A and/or Writer B) in accordance with embodiments of the inventive concept.

Referring to FIG. 2, the memory cell array 110 may have a plurality of memory cells MC 30, each of which stores one or more data bits. The memory cells MC may be connected to a plurality of word lines WLs, a plurality of source lines SLs, and a plurality of bit lines BLs. The bit lines BLs may be arranged to intersect with the word lines WLs. In addition, some of the memory cells may be reference memory cells 70, as further described below. The reference memory cells 70 may be connected to a plurality of reference lines RLs.

The memory cells may be arranged at intersection portions (not shown) between the word lines and the bit lines. The memory cells 30 may be grouped into memory blocks such as blocks 120 and 130. For example, for a 1 Mb memory block, one thousand (1000) word lines and one thousand (1000) bit lines can be associated with the memory block. Thus, each bit line associated with such a block would have one thousand (1000) memory cells associated therewith. It will be understood, however, that any suitable number of word lines, bit lines, and/or memory cells can be associated with each block. The sense amplifier circuitry 150 may include a plurality of sense amplifier circuits (e.g., 160 through 165). Each sense amplifier circuit is associated with a corresponding bit line of one of the memory blocks (e.g., 120 and 130), respectively. In other words, each bit line BL has a corresponding sense amplifier (e.g., 160, 165) associated therewith.

The address decoder 180 may be connected to the memory cell array 110 via the word lines WLs and source lines SLs. The address decoder 180 may operate responsive to the control of the control logic 190. The address decoder 180 may decode an input address to select the word lines WLs and source lines SLs. The address decoder 180 may receive power (e.g., a voltage or a current) from the control logic 190 to provide it to a selected or unselected word line.

The data input/output circuit 170 may be connected to the memory cell array 110 via the bit lines BLs. More specifically, each of the sense amplifiers (e.g., 160 and 165) can be coupled to a corresponding bit line of one of the memory blocks (e.g., 120 and 130). The data input/output circuit 170 may operate responsive to the control of the control logic 190. The data input/output circuit 170 may select a bit line in response to a bit line selection signal (not shown) from the address decoder 180. The data input/output circuit 170 may receive power (e.g., a voltage or a current) from the control logic 190 to provide it to a selected bit line.

The control logic 190 may be configured to control an overall operation of the memory device 105. The control logic 190 may be supplied with external power and/or control signals. The control logic 190 may generate power needed for an internal operation using the external power. The control logic 190 may control read, write, and/or erase operations in response to the control signals.

Figure 3A:
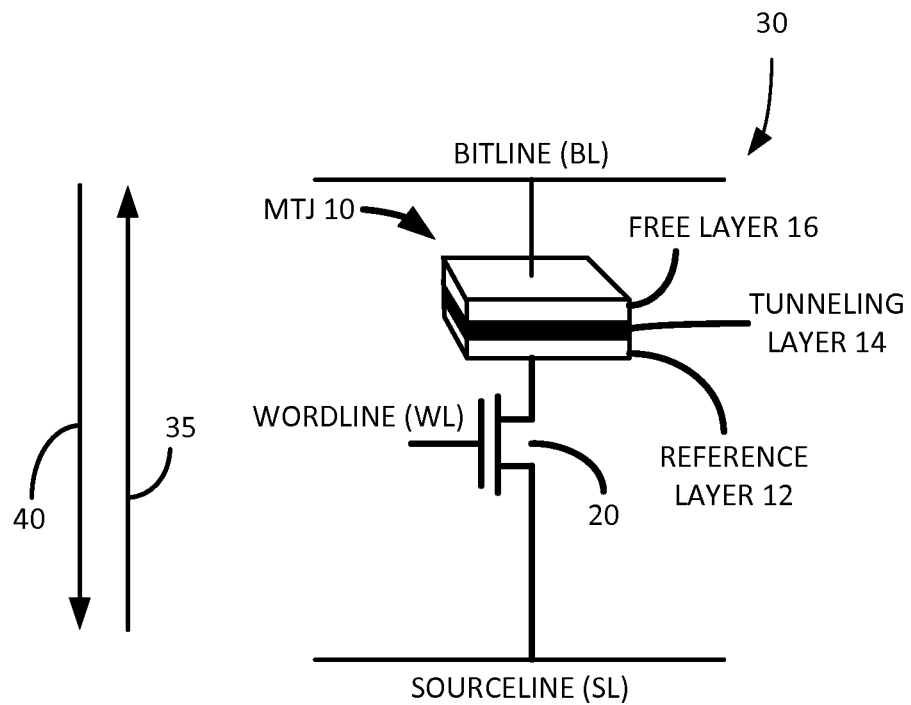
FIGS. 3A and 3B are a schematic diagram of an example STT MRAM memory cell, which can be included in the memory array of the memory device of FIG. 2.
Figure 3B:
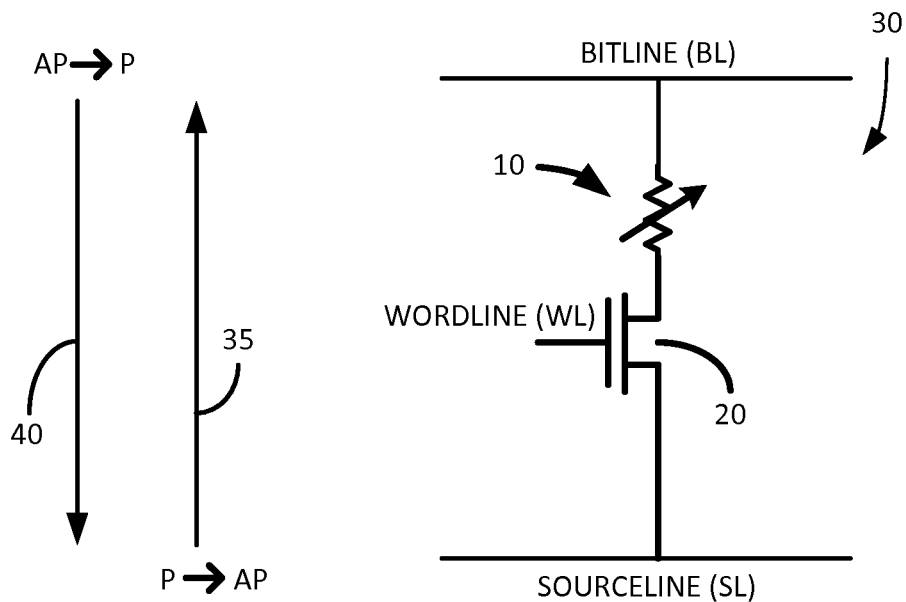

FIGS. 3A and 3B are a schematic diagram of an example STT MRAM memory cell 30 included in the memory cell array 110 of the memory device 105 of FIG. 2.

In some embodiments, the memory cell array 110 includes a plurality of spin transfer torque (STT) magnetoresistive random-access memory (MRAM) memory cells. It will be understood, however, that inventive concepts described herein apply to resistive memories of other types, such as MRAM (of the non-STT variety), memristor RAM, ReRAM, CBRAM, and the like.

FIG. 3A shows a magnetic tunnel junction (MTJ) 10, which forms a variable resistor in an STT-MRAM type memory cell, and an associated select transistor 20, together forming an STT-MRAM cell 30. The MTJ 10 includes a reference or pinned layer 12, a free layer 16, and a tunneling layer 14 disposed between the reference layer 12 and the free layer 16. Transistor 20 is often an NMOS type transistor due to its inherently higher current drive, lower threshold voltage, and smaller area relative to a PMOS type transistor. The current used to write a "1" in MRAM 30 can be different than the current used to write a "0". The asymmetry in the direction of current flow during these two write conditions is caused by the asymmetry in the gate-to-source voltage of transistor 20.

In the following description, an MRAM cell is defined as being in a logic "0" state when the free and reference layers of its associated MTJ are in a parallel (P) state, i.e., the MTJ exhibits a low resistance. Conversely, an MRAM cell is defined as being in a logic "1" state when the free and reference layers of its associated MTJ are in an anti-parallel (AP) state, i.e., the MTJ exhibits a high resistance. It will be understood that in other embodiments, the MRAM cell can be defined as being in the logic "0" state when in an AP state, and the logic "1" state when in a P state. Furthermore, in the following, it is assumed that the reference layer of the MTJ 10 faces its associated select transistor, as shown in FIG. 3A.

Therefore, in accordance with the discussion above, a current flowing along the direction of arrow 35 (i.e., the up direction) either (i) causes a switch from the P state to the AP state thus to write a "1", or (ii) stabilizes the previously established AP state of the associated MTJ. Likewise, a current flowing along the direction of arrow 40 (i.e., the down direction) either (i) causes a switch from the AP state to the P state thus to write a "0", or (ii) stabilizes the previously established P state of the associated MTJ. It is understood, however, that in other embodiments this orientation may be reversed so that the free layer of the MTJ faces its associated select transistor. In such embodiments (not shown), a current flowing along the direction of arrow 35 either (i) causes a switch from the AP state to the P, or (ii) stabilizes the previously established P state of the associated MTJ Likewise, in such embodiments, a current flowing along the direction of arrow 40 either (i) causes a switch from the P state to the AP state, or (ii) stabilizes the previously established AP state.

FIG. 3B is a schematic representation of MRAM 30 of FIG. 3A in which MTJ 10 is shown as a storage element whose resistance varies depending on the data stored therein. The MTJ 10 changes its state (i) from P to AP when the current flows along arrow 35, and/or (ii) from AP to P when the current flows along arrow 40.

The voltage required to switch the MTJ 10 from an AP state to a P state, or vice versa, must exceed a critical value $V_c$. The current corresponding to this voltage is referred to as the critical or switching current $I_c$. Under a normal operating mode, to transition from the P state (i.e., low resistance state) to AP state (i.e., high resistance state), a positive voltage of $V_c$ is applied so that a current level of at least the switching current $I_c$ flows through the memory cell. Once in the AP state, removing the applied voltage does not affect the state of the MTJ 10. Likewise, to transition from the AP state to the P state under the normal operating mode, a negative voltage of $V_c$ is applied so that a current level of at least the switching current $I_c$ flows through the memory cell in the opposite direction. Once in the P state, removing the applied voltage does not affect the state of the MTJ 10.

In other words, MTJ 10 can be switched from an anti-parallel state (i.e., high resistance state, or logic "1" state) to a parallel state so as to store a "0" (i.e., low resistance state, or logic "0" state). Assuming that MTJ 10 is initially in a logic "1" or AP state, to store a "0", under the normal operating mode, a current at least as great or greater than the critical current $I_c$ is caused to flow through transistor 20 in the direction of arrow 40. To achieve this, the source node (SL or source line) of transistor 20 is coupled to the ground potential via a resistive path (not shown), a positive voltage is applied to the gate node (WL or word line) of transistor 20, and a positive voltage is applied to the drain node (BL or bit line) of transistor 20.

As mentioned above, MTJ 10 can also be switched from a parallel state to an anti-parallel state so as to store a "1". Assuming that MTJ 10 is initially in a logic "0" or P state, to store a "1", under the normal operating mode, a current at least as great or greater than the critical current $I_c$ is caused to flow through transistor 20 in the direction of arrow 35. To achieve this, node SL is supplied with a positive voltage via a resistive path (not shown), node WL is supplied with a positive voltage, and node BL is coupled to the ground potential via a resistive path (not shown).

Figure 4:
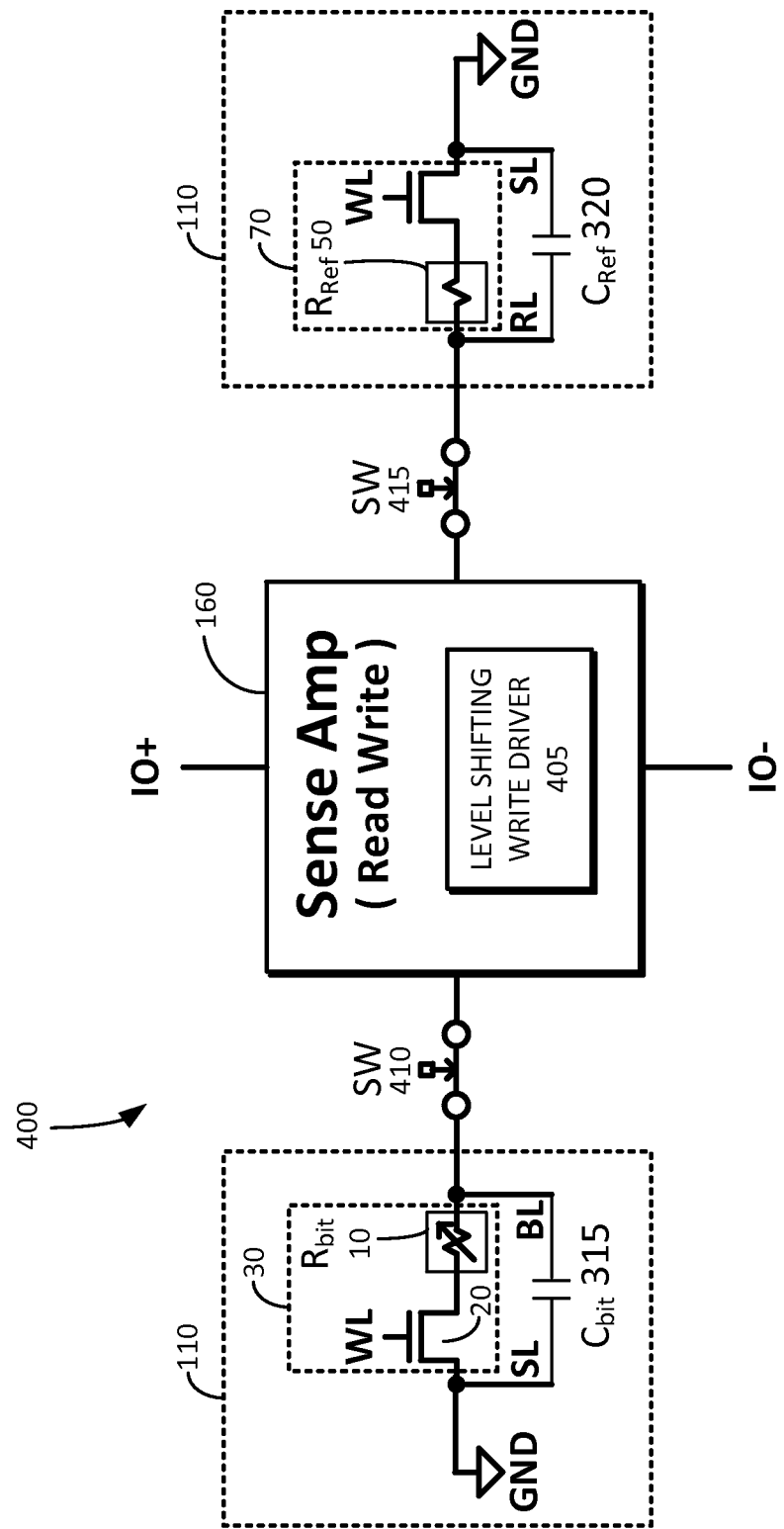
FIG. 4 is an example diagram of a sense amplifier of FIG. 2 associated with memory cells of the memory device of FIG. 2, and including a level shifting write driver, in accordance with one embodiment of the inventive concept.

FIG. 4 is an example diagram 400 of a sense amplifier (e.g., 160) of FIG. 2 associated with memory cells 110 of the memory device of FIG. 2, and including a level shifting write driver 405, in accordance with one embodiment of the inventive concept.

The sense amplifier 160 may include differential input and/or output terminals IO+ and IO−. In some embodiments, differential input terminals (e.g., In+ and In−) are separate from differential output terminals (e.g., Out+ and Out−). The sense amplifier 160 is coupled to the memory cell 30 via switch 410 and to the reference cell 70 via switch 415. It will be understood that while a single memory cell 30 is shown, any suitable number of memory cells can be coupled to or otherwise associated with the sense amplifier 160.

The sense amplifier circuit 160 is configured to output a first output signal and a second output signal opposite the first output signal. The output signals correspond to either a logical value "0" or a logical value "1" depending on the bit data stored in the memory cell 30.

The reference resistor $R_{REF}$ 50 of the reference memory cell 70 is used as a reference when determining whether the memory cell 30 stores a logical value "0" (e.g., when $R_{BIT}$ is equal to $R_L$) or logical value "1" (e.g., when $R_{BIT}$ is equal to $R_H$). The gate terminal of the select transistor 20 of the memory cell 30 is coupled to a corresponding word line WL.

The resistor $R_{REF}$ 50 can be designed to have a certain resistance. For example, the resistor $R_{REF}$ 50 can have an intermediate resistance between the high resistance $R_H$ and the low resistance $R_L$ of the $R_{BIT}$ resistor. In one example embodiment, the $R_{REF}$ resistor has a resistance of $2/(1/R_H+1/R_L)$. In another example embodiment, the $R_{REF}$ resistor has a resistance of either $R_H$ or $R_L$. To facilitate the explanation of the operation of the sense amplifier 160, the $R_{REF}$ resistor will be assumed to have a resistance of $2/(1/R_H+1/R_L)$.

Due to the memory cell circuitry and associated conductive lines, a bit line capacitor $C_{BIT}$ 315 (i.e., parasitic capacitance) exists between the bit line BL and the source line SL. Similarly, a reference line capacitor $C_{REF}$ 320 (i.e., parasitic capacitance) exists between the reference line RL and a positive power supply voltage node VDD. The bit line capacitor 315 and the reference line capacitor 320 are pre-charged during a pre-charge phase of the sense amplifier circuit 160. The switches 410 and 415 are configured to connect or disconnect the sense amplifier circuit 160 to or from the memory and reference cells of the memory cell array 110.

Figures 5A, 5B, 5C, 5D, 5E:
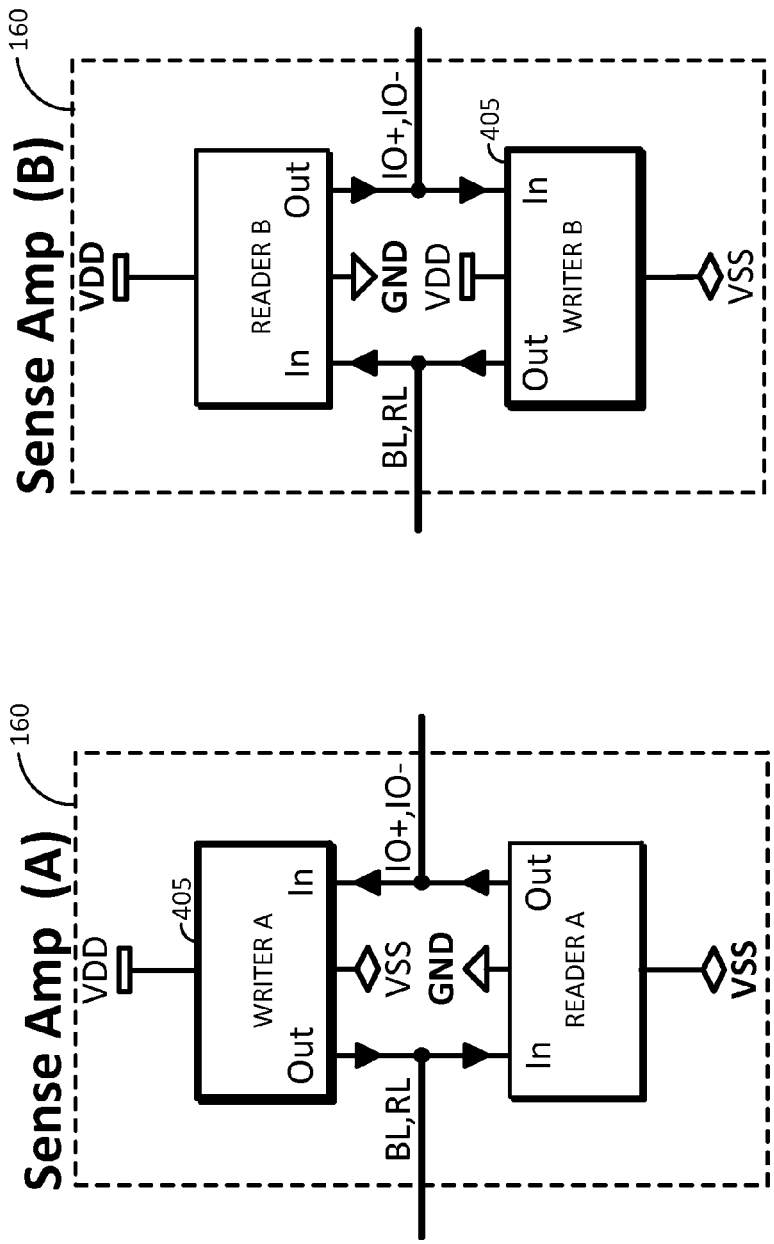
FIG. 5A is an example block diagram of the sense amplifier of FIG. 4 according to an embodiment of the inventive concept.
FIG. 5B is an example waveform diagram of output and input voltage levels of the sense amplifier of FIG. 5A.
FIG. 5C is another example block diagram of the sense amplifier of FIG. 4 according to another embodiment of the inventive concept.
FIG. 5D is an example waveform diagram of output and input voltage levels of the sense amplifier of FIG. 5C.
FIG. 5E is an example waveform diagram of voltage levels in accordance with some embodiments of the inventive concept.

FIG. 5A is an example block diagram of the sense amplifier 160 of FIG. 4 according to an embodiment of the inventive concept. FIG. 5B is an example waveform diagram of output and input voltage levels of the sense amplifier of FIG. 5A. Reference is now made to FIGS. 5A and 5B.

The sense amplifier 160 of FIG. 5A includes a level shift write driver Writer A, which corresponds to the write driver 405 of FIG. 4. Writer A receives a first voltage potential VDD as a positive voltage supply and a second voltage potential VSS as a negative voltage supply. One or more differential output terminals are coupled to bitlines BL and/or reference lines RL. One or more differential input terminals are coupled to IO+ and IO− lines. As shown in FIG. 5B, an input voltage of the differential input terminals is substantially between the second voltage potential VSS and ground potential GND, which is one half of a difference of the first voltage potential VDD and the second voltage potential VSS. An output voltage that is output by the differential output terminals fully swings between VSS and VDD.

FIG. 5C is another example block diagram of the sense amplifier of FIG. 4 according to another embodiment of the inventive concept. FIG. 5D is an example waveform diagram of output and input voltage levels of the sense amplifier of FIG. 5C. Reference is now made to FIGS. 5C and 5D.

The sense amplifier 160 of FIG. 5C includes a level shift write driver Writer B, which corresponds to the write driver 405 of FIG. 4. The sense amplifier 160 may include the Writer A and/or the Writer B. Writer B receives a first voltage potential VDD as a positive voltage supply and a second voltage potential VSS as a negative voltage supply. One or more differential output terminals are coupled to bitlines BL and/or reference lines RL. One or more differential input terminals are coupled to IO+ and IO− lines. As shown in FIG. 5D, an input voltage of the differential input terminals is substantially between the first voltage potential VDD and ground potential GND, which is one half of a difference of the first voltage potential VDD and the second voltage potential VSS. An output voltage that is output by the differential output terminals fully swings between VSS and VDD.

FIG. 5E is an example waveform diagram of voltage levels in accordance with some embodiments of the inventive concept. As shown in FIG. 5E, VDD is positive 1.2 V, GND is zero V, and VSS is negative 1.2 V. It will be understood that any suitable voltage levels can be used. For example, rather than VDD, GND, and VSS, the external power supply voltage potentials may be VCC, VDD, and GND, respectively, for example where VCC is equal to 2.4 V, VDD is equal to 1.2 V, and GND is equal to zero V. The relative difference in the voltage potentials of the various supplies provides the appropriate biasing of the circuits.

Figures 6A, 6B:
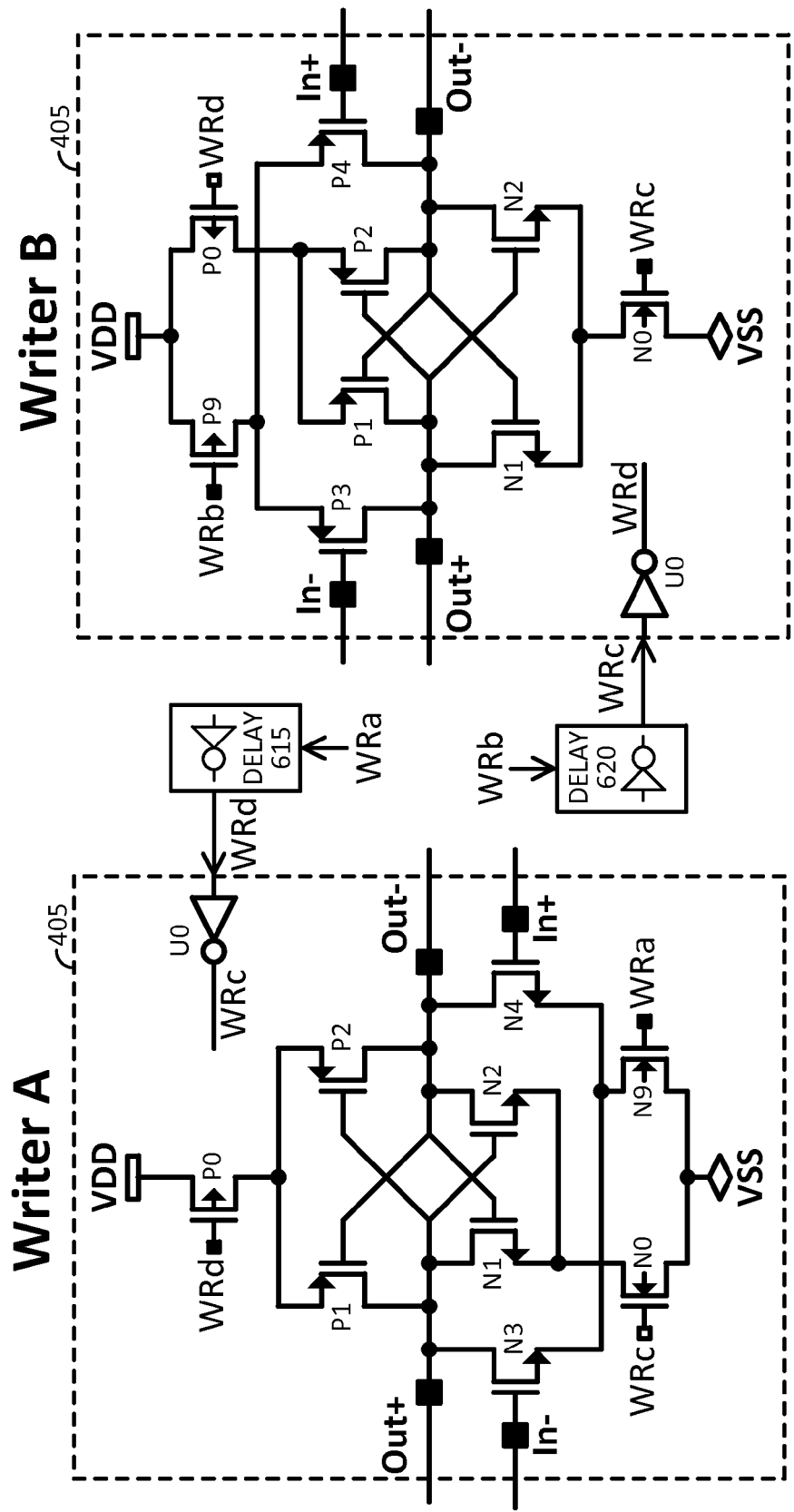
FIG. 6A is an example circuit diagram of the level shifting write driver of FIG. 4 according to an embodiment of the inventive concept.
FIG. 6B is an example circuit diagram of the level shifting write driver of FIG. 4 according to another embodiment of the inventive concept.
Figures 7A, 7B:
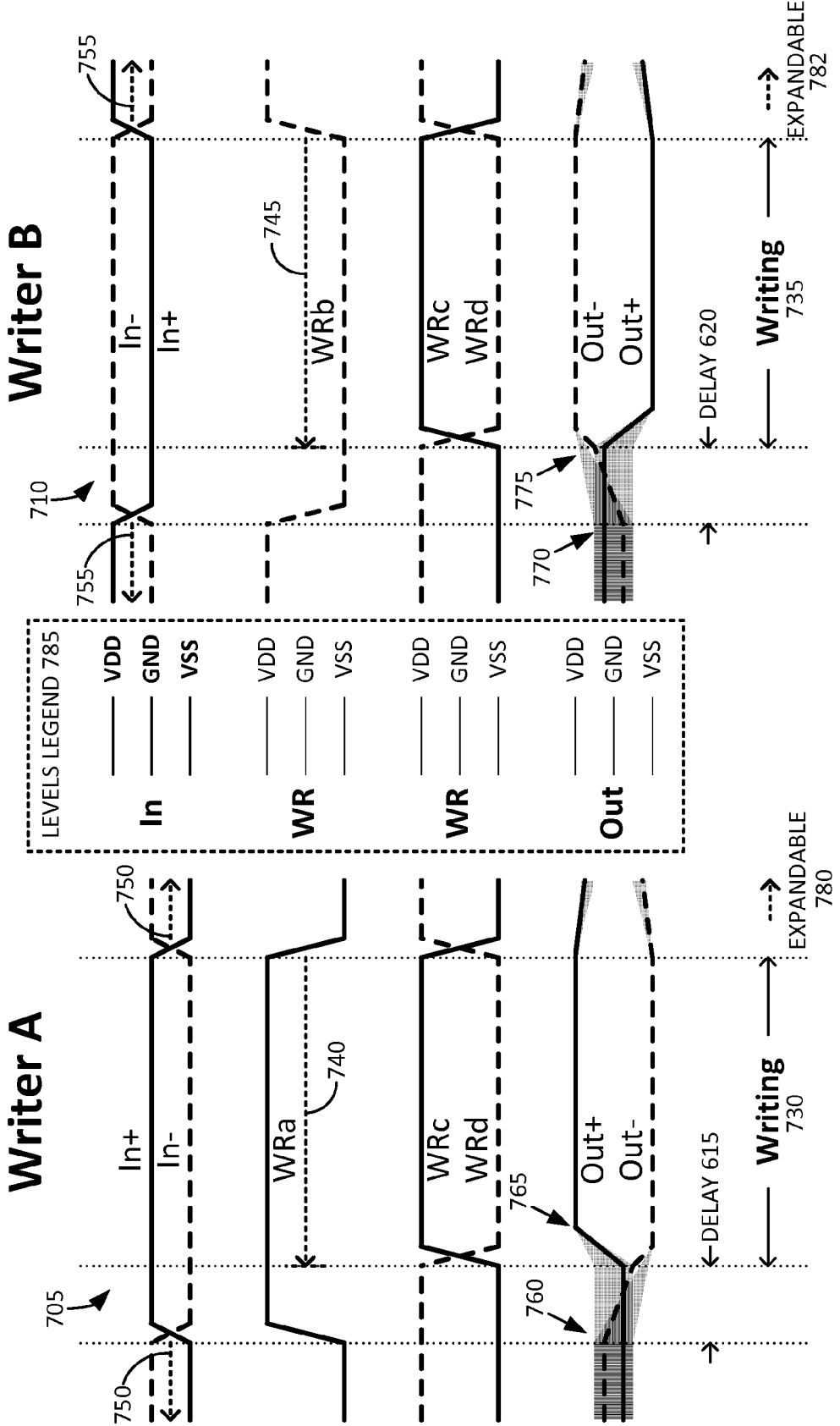
FIG. 7A is an example waveform diagram showing waveforms associated with the level shifting write driver of FIG. 6A in accordance with some embodiments of the inventive concept.
FIG. 7B is an example waveform diagram showing waveforms associated with the level shifting write driver of FIG. 6B in accordance with some embodiments of the inventive concept.

FIG. 6A is an example circuit diagram of the level shifting write driver 405 of FIG. 4 according to an embodiment of the inventive concept. The write driver 405 of FIG. 6A is referred to as Writer A. FIG. 7A is an example waveform diagram 705 showing waveforms associated with the level shifting write driver Writer A of FIG. 6A in accordance with some embodiments of the inventive concept. Reference is now made to FIGS. 6A and 7A.

Referring to FIG. 6A, a latch circuit is configured by PMOS latch transistors P1 and P2 and NMOS latch transistors N1 and N2. Differential input terminals (i.e., In− and In+) are coupled to the gates of NMOS type transistors N3 and N4, respectively. The transistors N3 and N4 are signal transistors, which are smaller in size than the latch transistors P1, P2, N1, and N2. An input voltage ranges between the voltage potential VSS and ground potential GND, where GND is one half of the difference between VDD and VSS. An output voltage fully swings between VSS and VDD.

A control signal WRa is delayed and inverted by the delay circuit 615 to produce delayed control signal WRd, which is inverted by inverter U0 to produce the delayed control signal WRc. In an initial state, the control signal WRa is not asserted or is otherwise LOW, WRc is also not asserted or is otherwise LOW, and WRd is asserted or is otherwise HIGH. In the initial state, the output voltage level is undefined because the switch transistors P0, N0, and N9 are off, which causes the latch transistors P1, P2, N1 and N2 to be in an undefined or dangling condition. In response to the control signal WRa being asserted or being otherwise set to HIGH, the control signal WRd is not asserted or is otherwise set to LOW after the delay 615, and the control signal WRc is asserted or is otherwise set to HIGH after the delay and the inversion. Depending on the voltage levels at the differential input terminals In− and In+, the latch circuit will latch, based on positive feedback, either a logical high value (e.g., '1') or a logical low value (e.g., '0') at the differential output terminals Out+ and Out−, respectively.

More specifically, when the WRa signal is asserted or is otherwise set to HIGH, switch transistor N9 is turned on. The switch transistor N9 is a signal transistor, which is smaller in size relative to switch transistors P0, N0, and latch transistors P1, P2, N1, and N2. When the control signal WRa is asserted, as shown in FIG. 7A, the output voltage levels of the differential output terminals Out+ and Out− are undefined because the latch circuit is directly coupled to the output terminals.

Nevertheless, as shown in FIG. 7A, the output voltage levels begin to swing at 760 in response to the control signal WRa being asserted, and based on a difference of the input voltage levels at the differential input terminals In− and In+. In other words, if the input voltage level at In+ is HIGH (i.e., GND as this is an input voltage level) and the input voltage level at In− is LOW (i.e., VSS), then the voltage level at Out− will begin to swing toward LOW (i.e., VSS). After the delay 615, the control signal WRc is HIGH and the control signal WRd is LOW, which causes the driving transistor N0 and the driving transistor P0 to turn on. The latch circuit then latches at 765, based on positive feedback, a logical value of '1' or HIGH (i.e., VDD) at the differential output terminal Out+ and a logical value of '0' or LOW (i.e., VSS) at the differential output terminal Out−.

The various voltage levels are shown at legend 785. It will be understood that the input waveform can be extended in either direction as shown by arrows 750. Similarly, the edge of the control signal WRa can also be located elsewhere along a line as indicated by arrow 740. In addition, the writing region 730 can be expanded as indicated by arrow 780. It will be understood that any suitable adjustments to the input and control waveforms can be made and still fall within the inventive concepts disclosed herein.

The NMOS type transistors N3, N4, and N9 are signal transistors, which are smaller and use relatively less die area than driving transistors, as explained in further detail below.

FIG. 6B is an example circuit diagram of the level shifting write driver 405 of FIG. 4 according to another embodiment of the inventive concept. The write driver 405 of FIG. 6B is referred to as Writer B. The write driver 405 may include Writer A and/or Writer B. FIG. 7B is an example waveform diagram 710 showing waveforms associated with the level shifting write driver Writer B of FIG. 6B in accordance with some embodiments of the inventive concept. Reference is now made to FIGS. 6B and 7B.

Referring to FIG. 6B, a latch circuit is configured by PMOS latch transistors P1 and P2 and NMOS latch transistors N1 and N2. Differential input terminals (i.e., In− and In+) are coupled to the gates of PMOS type transistors P3 and P4, respectively. The transistors P3 and P4 are signal transistors, which are smaller in size than the latch transistors P1, P2, N1, and N2. An input voltage ranges between the voltage potential VDD and ground potential GND, where GND is one half of the difference between VDD and VSS. An output voltage fully swings between VSS and VDD.

A control signal WRb is delayed and inverted by the delay circuit 620 to produce delayed control signal WRc, which is inverted by inverter U0 to produce the delayed control signal WRd. In an initial state, the control signal WRb is asserted or is otherwise HIGH, WRd is also asserted or is otherwise HIGH, and WRc is not asserted or is otherwise LOW. In the initial state, the output voltage level is undefined because the switch transistors P0, N0, and P9 are off, which causes the latch transistors P1, P2, N1 and N2 to be in an undefined or dangling condition. In response to the control signal WRb being not asserted or being otherwise set to LOW, the control signal WRd is also not asserted or is otherwise set to LOW after the delay 620, and the control signal WRc is asserted or is otherwise set to HIGH after the delay and the inversion. Depending on the voltage levels at the differential input terminals In− and In+, the latch circuit will latch, based on positive feedback, either a logical high value (e.g., '1') or a logical low value (e.g., '0') at the differential output terminals Out+ and Out−, respectively.

More specifically, when the WRb signal is not asserted or is otherwise set to LOW, switch transistor P9 is turned on. The switch transistor P9 is a signal transistor, which is smaller in size relative to switch transistors P0, N0, and latch transistors P1, P2, N1, and N2. When the control signal WRb is not asserted or is otherwise set to LOW, as shown in FIG. 7B, the output voltage levels of the differential output terminals Out+ and Out− are undefined because the latch circuit is directly coupled to the output terminals.

Nevertheless, as shown in FIG. 7B, the output voltage levels begin to swing at 770 in response to the control signal WRb being not asserted or being otherwise set to LOW, and based on a difference of the input voltage levels at the differential input terminals In− and In+. In other words, if the input voltage level at In+ is LOW (i.e., GND as this is an input voltage level) and the input voltage level at In− is HIGH (i.e., VDD), then the voltage level at Out− will begin to swing toward HIGH (i.e., VDD). After the delay 620, the control signal WRc is HIGH and the control signal WRd is LOW, which causes the driving transistor N0 and the driving transistor P0, respectively, to turn on. The latch circuit then latches at 775, based on positive feedback, a logical value of '1' or HIGH (i.e., VDD) at the differential output terminal Out− and a logical value of '0' or LOW (i.e., VSS) at the differential output terminal Out+.

As mentioned above, the various voltage levels are shown at legend 785. It will be understood that the input waveform can be extended in either direction as shown by arrows 755. Similarly, the edge of the control signal WRb can also be located elsewhere along a line as indicated by arrow 745. In addition, the writing region 735 can be expanded as indicated by arrow 782. It will be understood that any suitable adjustments to the input and control waveforms can be made and still fall within the inventive concepts disclosed herein.

The PMOS type transistors P3, P4, and P9 are signal transistors, which are smaller and use relatively less die area than driving transistors, as explained in further detail below.

The latched embodiments illustrated in FIGS. 6A and 6B are particularly useful for memories having a common source line architecture in which a one-half voltage swing is received at the differential input terminals rather than a full voltage swing at the inputs. A common source line architecture is one in which source lines are merged or otherwise combined into a single common source line having a common voltage potential at any given time.

Figure 8:
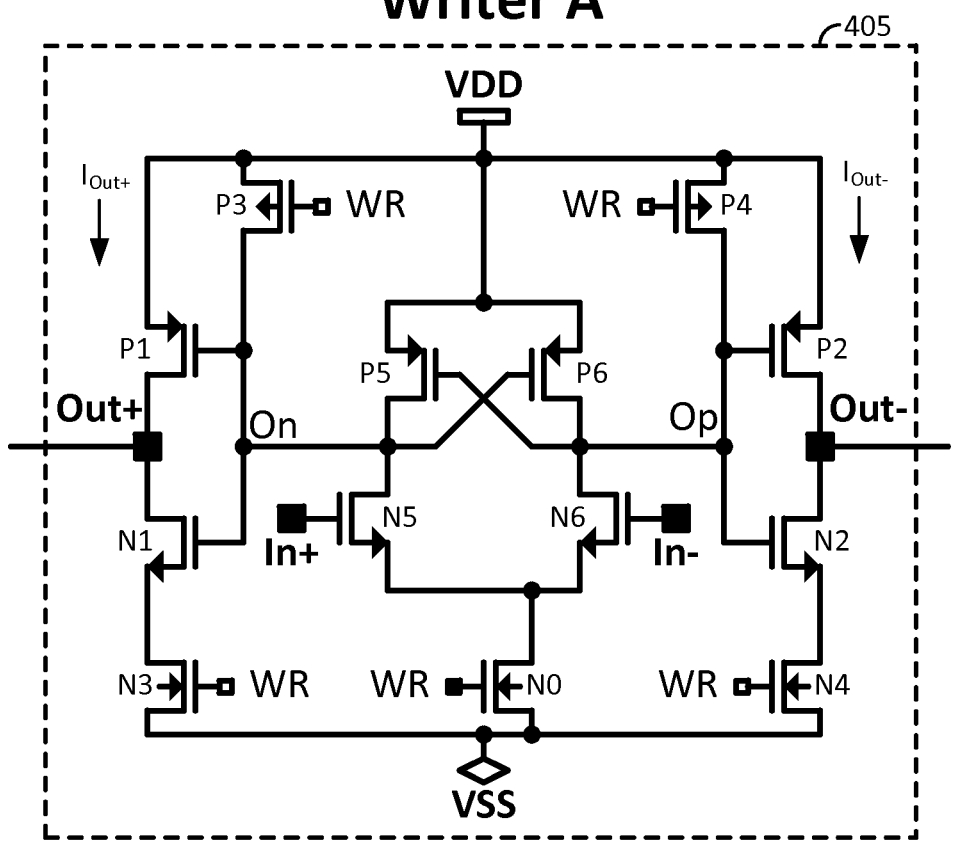
FIG. 8 is an example circuit diagram of the level shifting write driver of FIG. 4 according to yet another embodiment of the inventive concept.
Figures 10A, 10B:
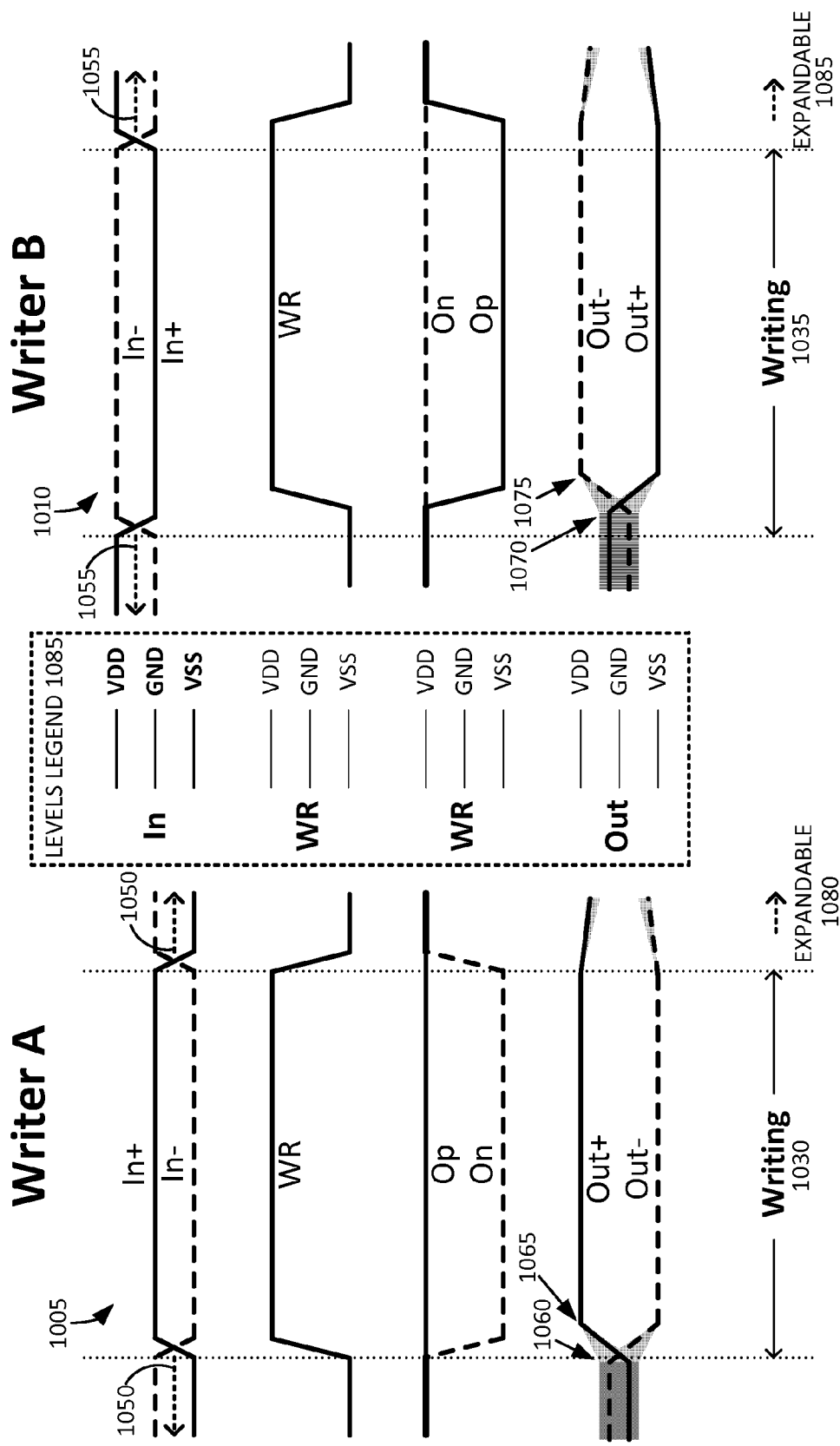
FIG. 10A is an example waveform diagram showing waveforms associated with the level shifting write driver of FIG. 8 in accordance with some embodiments of the inventive concept.
FIG. 10B is an example waveform diagram showing waveforms associated with the level shifting write driver of FIGS. 9A and 9B in accordance with some embodiments of the inventive concept.

FIG. 8 is an example circuit diagram of the level shifting write driver 405 of FIG. 4 according to yet another embodiment of the inventive concept. The write driver 405 of FIG. 8 is referred to as Writer A. FIG. 10A is an example waveform diagram 1005 showing waveforms associated with the level shifting write driver Writer A of FIG. 8 in accordance with some embodiments of the inventive concept. Reference is now made to FIGS. 8 and 10A.

Referring to FIG. 8, a latch circuit is configured by PMOS latch transistors P5 and P6. Differential input terminals (i.e., In+ and In−) are coupled to the gates of NMOS type transistors N5 and N6, respectively. The transistors P5, P6, N5 and N6 are signal transistors, which are smaller in size than the driving transistors. An input voltage can range between the voltage potential VSS and the ground potential GND or can fully swing between VDD and VSS, where GND is one half of the difference between VDD and VSS. An output voltage fully swings between VSS and VDD.

The embodiment illustrated in FIG. 8 advantageously reduces die area in configurations having a one-half voltage swing at the input as well as in configurations having a full voltage swing at the input. Moreover, the embodiment illustrated in FIG. 8 is operable within memories having a separate source line architecture used in many if not most embedded memories, as well as within memories having a common source line architecture. A separate source line architecture is one in which each bit line is associated with a separate source line, each of which is independently set to a high voltage or a low voltage. As mentioned above, a common source line architecture is one in which source lines are merged or otherwise combined into a single common source line having a common voltage potential at any given time. In addition, the embodiment illustrated in FIG. 8 provides a simple control feature in which a single logic signal controls the operation of the entire write driver circuit. A full range of writing is also provided without timing losses as a result of delay circuits. Another advantage is a small consumption of die area from the size-effective structure of a non-stacked PMOS configuration.

A single control signal WR is received by the Writer A of FIG. 8. In an initial state, the control signal WR is not asserted or is otherwise LOW. In the initial state, the output voltage level is undefined because the switch transistors N0, N3, and N4 are off, and in addition, driving transistors P1 and P2 are off because node "On" and node "Op" are pre-charged to the power supply voltage potential VDD through signal transistors P3 and P4, respectively, which are initially on. In response to the control signal WR being asserted or being otherwise set to HIGH, the signal type switch transistors P3 and P4 are turned off, the signal type switch transistor N0 is turned on, and the driving transistors N3 and N4 are turned on.

As a result, the output voltage levels begin to swing at 1060 in response to the control signal WR being asserted, and based on a difference of the input voltage levels at the differential input terminals In− and In+. In other words, if the input voltage level at In+ is HIGH (i.e., GND as this is an input voltage level) and the input voltage level at In− is LOW (i.e., VSS), then the voltage level at Out− will begin to swing toward LOW (i.e., VSS) and the voltage level at Out+ will begin to swing toward HIGH (i.e., VDD). In response to the control signal WR being HIGH, the transistors N3, N0, and N4 are turned on. The latch circuit then latches at 1065, based on positive feedback, the voltage potential VSS at the node "On" and the voltage potential VDD at the node "Op." As a result, a logical value of '1' or HIGH (i.e., VDD) is transferred to the differential output terminal Out+ and a logical value of '0' or LOW (i.e., VSS) is transferred to the differential output terminal Out−.

Stated differently, depending on the voltage levels at the differential input terminals In− and In+, the latch circuit will latch, based on positive feedback, either the positive power supply voltage level VDD or the negative power supply voltage level VSS at the nodes "On" and "Op." In response to the respective voltage potentials at nodes "On" and "Op," the driving transistors P1, N1, P2, and N2 will be turned either on or off, thereby pulling the differential output terminal up to VDD or down to VSS. For example, if the voltage potential at node "Op" is VDD, then the driving transistor P2 will be turned off and the driving transistor N2 will be turned on, thereby pulling the differential output terminal Out− to the negative supply voltage potential VSS. Similarly, if the voltage potential at node "On" is VSS, then the driving transistor N1 will be turned off and the driving transistor P1 will be turned on, thereby pulling the differential output terminal Out+ to the positive supply voltage potential VDD.

The various voltage levels are shown at legend 1085. It will be understood that the input waveform can be extended in either direction as shown by arrows 1050. In addition, the writing region 1030 can be expanded as indicated by arrow 1080. It will be understood that any suitable adjustments to the input and control waveforms can be made and still fall within the inventive concepts disclosed herein.

By way of further explanation, a first output section includes one or more first driving transistors (e.g., P1 and N1) coupled to a first differential output terminal (Out+), the one or more first driving transistors being configured to drive a first current $T_{Out+}$ through the first output section and not through the cross-coupled latch (P5 and P6). Similarly, a second output section includes one or more second driving transistors (e.g., P2 and N2) coupled to a second differential output terminal (Out−), the one or more second driving transistors being configured to drive a second current $T_{Out−}$ through the second output section and not through the cross-coupled latch (P5 and P6). Thus, the write driver Writer A is divided into two stages, or in other words, the driven currents are isolated from the latch circuit.

Notably, no two PMOS type transistors are serially connected in the write driver Writer A, which significantly reduces the consumption of die area, as explained in further detail below.

Pertaining to structural details of the write driver circuit, a first output section includes PMOS type driving transistor P1, NMOS type driving transistors N1 and N3, and PMOS type signal transistor P3. The transistor P1 of the first output section can be coupled to a first voltage potential VDD and to the first differential output terminal Out+. In addition, the transistor N1 of the first output section can be coupled to the first differential output terminal Out+ and to a second voltage potential VSS. Moreover, the transistor P3 is coupled to the gates of N1 and P1 and to the first voltage potential VDD. A gate of the transistor P3 can receive the control signal WR. The transistor N3 of the first output section can be coupled to the transistor N1 and to the second voltage potential VSS. A gate of the driving transistor N3 can receive the control signal WR.

A second output section includes PMOS type driving transistor P2, NMOS type driving transistors N2 and N4, and PMOS type signal transistor P4. The transistor P2 of the second output section can be coupled to a first voltage potential VDD and to the second differential output terminal Out−. In addition, the transistor N2 of the second output section can be coupled to the second differential output terminal Out− and to the second voltage potential VSS. Moreover, the transistor P4 is coupled to the gates of N2 and P2 and to the first voltage potential VDD. A gate of the transistor P4 can receive the control signal WR. The transistor N4 of the second output section can be coupled to the transistor N2 and to the second voltage potential VSS. A gate of the driving transistor N4 can receive the control signal WR.

The cross-coupled latch includes a first PMOS type signal transistor P5 having a source coupled to the first voltage potential VDD, a drain coupled to the first node "On" that is coupled to gates of the driving transistors P1 and N1 of the first output section, and a gate coupled to the second node "Op" that is coupled to gates of the driving transistors P2 and N2 of the second output section. In addition, the cross-coupled latch includes a second PMOS type signal transistor P6 having a source coupled to the first voltage potential VDD, a drain coupled to the second node "Op," and a gate coupled to the first node "On."

The level shifting Writer A 405 of FIG. 8 further includes an input section including a first NMOS type signal transistor N5 coupled to a first differential input terminal In+, a second NMOS type signal transistor N6 coupled to a second differential input terminal In−, and a third NMOS type signal transistor N0 coupled to the transistor N5 and N6 of the input section. The transistor N0 is configured to receive the control signal WR. The nodes "Op" and "On" are both configured to have the first voltage potential VDD during the initial state. An input voltage of the first or second differential input terminals (In+ and/or In−) is substantially between the second voltage potential VSS and the ground potential GND, which is one half of a difference of the first voltage potential VDD and the second voltage potential VSS.

The transistor N0 and one of the transistors N5 or N6 of the input section are configured to pull one of the corresponding nodes "On" or "Op" from the first voltage potential VDD to the second voltage potential VSS responsive to the control signal WR. The cross-coupled latch is configured to latch respective voltage potentials (e.g., VDD or VSS) at the nodes "On" or "Op." The first output section is configured to drive the first differential output terminal Out+ to one of the first voltage potential VDD or the second voltage potential VSS responsive to the voltage potential at the node "On." The second output section is configured to drive the second differential output terminal Out− to the other of the first voltage potential VDD or the second voltage potential VSS responsive to the voltage potential at the node "Op."

Figure 9A:
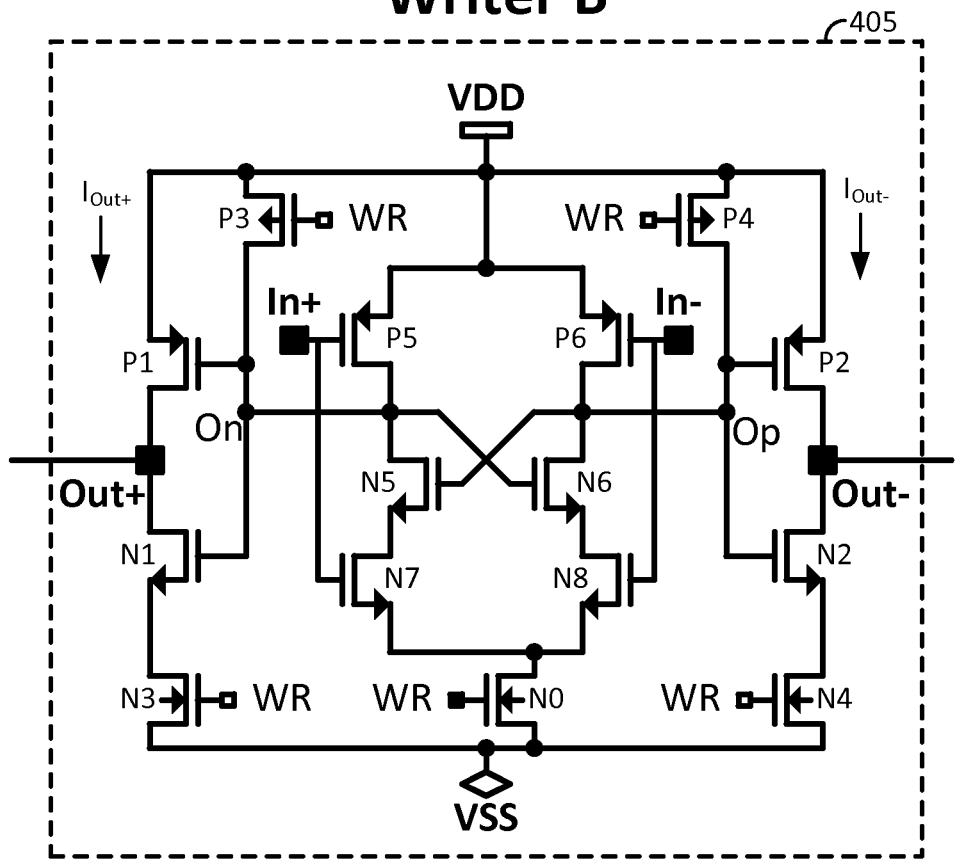
FIG. 9A is an example circuit diagram of the level shifting write driver of FIG. 4 according to still another embodiment of the inventive concept.
Figure 9B:
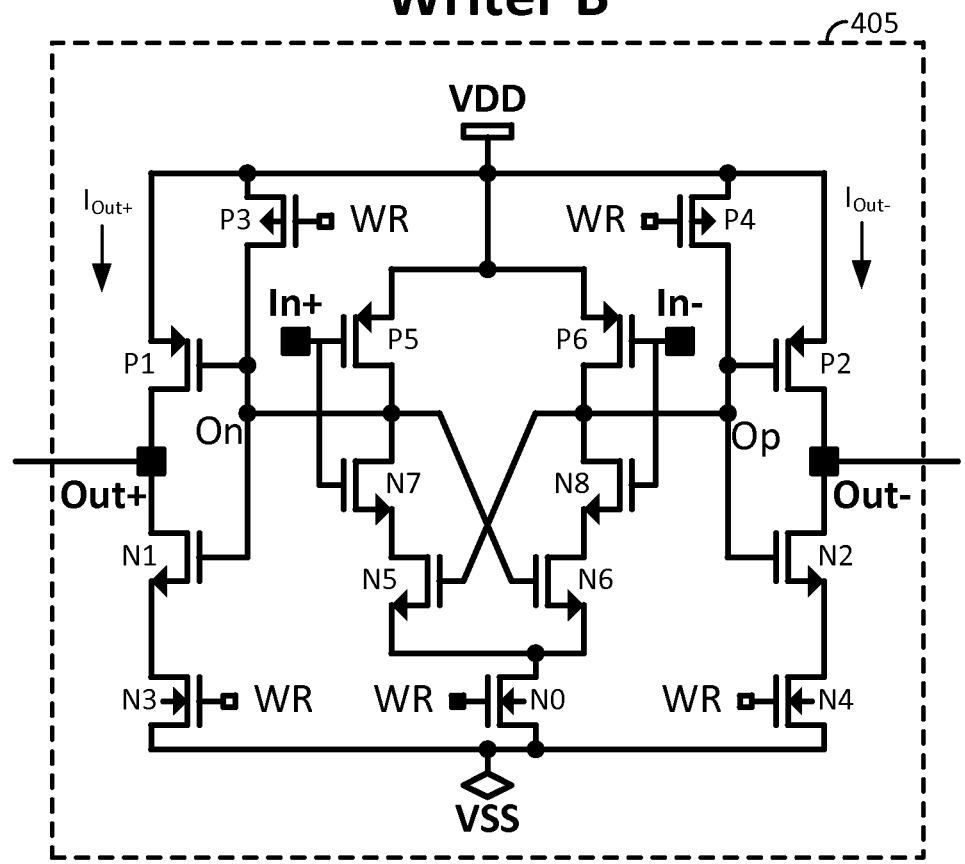
FIG. 9B is an example circuit diagram of the level shifting write driver of FIG. 4 according to another embodiment of the inventive concept.

FIG. 9A is an example circuit diagram of the level shifting write driver 405 of FIG. 4 according to still another embodiment of the inventive concept. FIG. 9B is an example circuit diagram of the level shifting write driver 405 of FIG. 4 according to another embodiment of the inventive concept, which is a logically equivalent circuit to that shown in FIG. 9A. The write driver 405 of FIGS. 9A and 9B is referred to as Writer B. The write driver 405 may include the Writer A and/or the Writer B. FIG. 10B is an example waveform diagram 1010 showing waveforms associated with the level shifting write driver Writer B of FIGS. 9A and 9B in accordance with some embodiments of the inventive concept. Reference is now made to FIGS. 9A, 9B, and 10B.

Referring to FIG. 9A, a latch circuit is configured by NMOS latch transistors N5 and N6. Differential input terminals (i.e., In+ and In−) are coupled to the gates of PMOS type transistors P5 and P6, respectively. The transistors P5, P6, N5 and N6 are signal transistors, which are smaller in size than driving transistors. An input voltage can range between the voltage potential VDD and ground potential GND, where GND is one half of the difference between VDD and VSS. An output voltage fully swings between VSS and VDD. The latched embodiments illustrated in FIGS. 9A and 9B are particularly useful for memories having a common source line architecture in which a one-half voltage swing is received at the differential input terminals rather than a full voltage swing at the inputs. As mentioned above, a common source line architecture is one in which source lines are merged or otherwise combined into a single common source line having a common voltage potential at any given time.

A single control signal WR is received by the Writer B of FIG. 9A. In an initial state, the control signal WR is not asserted or is otherwise LOW. In the initial state, the output voltage level is undefined because the switch transistors N0, N3, and N4 are off, and in addition, driving transistors P1 and P2 are off because node "On" and node "Op" are pre-charged to the power supply voltage potential VDD through signal transistors P3 and P4, respectively, which are initially on. In response to the control signal WR being asserted or being otherwise set to HIGH, the signal type switch transistors P3 and P4 are turned off, the signal type switch transistor N0 is turned on, and the driving transistors N3 and N4 are turned on.

As a result, the output voltage levels begin to swing at 1070 in response to the control signal WR being asserted, and based on a difference of the input voltage levels at the differential input terminals In− and In+. In other words, if the input voltage level at In+ is LOW (i.e., GND as this is an input voltage level) and the input voltage level at In− is HIGH (i.e., VDD), then the transistor N7 is turned off, the transistor N8 is turned on, the voltage level at Out+ will begin to swing toward LOW (i.e., VSS), and the voltage level at Out− will begin to swing toward HIGH (i.e., VDD). The transistor N6 of the latch circuit passes current but the transistor N5 does not because N7 is turned off. In response to the control signal WR being HIGH, the transistors N3, N0, and N4 are turned on. The latch circuit latches at 1075 the voltage potential VDD at the node "On" and the voltage potential VSS at the node "Op." As a result, a logical value of '1' or HIGH (i.e., VDD) is transferred to the differential output terminal Out− and a logical value of '0' or LOW (i.e., VSS) is transferred to the differential output terminal Out+.

Stated differently, depending on the voltage levels at the differential input terminals In− and In+, the latch circuit will latch either the positive power supply voltage level VDD or the negative power supply voltage level VSS at the nodes "On" and "Op." In response to the respective voltage potentials at nodes "On" and "Op," the driving transistors P1, N1, P2, and N2 will be turned either on or off, thereby pulling the differential output terminal up to VDD or down to VSS. For example, if the voltage potential at node "Op" is VSS, then the driving transistor P2 will be turned on and the driving transistor N2 will be turned off, thereby pulling the differential output terminal Out− to the positive supply voltage potential VDD. Similarly, if the voltage potential at node "On" is VDD, then the driving transistor N1 will be turned on and the driving transistor P1 will be turned off, thereby pulling the differential output terminal Out+ to the negative supply voltage potential VSS.

The various voltage levels are shown at legend 1085. It will be understood that the input waveform can be extended in either direction as shown by arrows 1055. In addition, the writing region 1035 can be expanded as indicated by arrow 1085. It will be understood that any suitable adjustments to the input and control waveforms can be made and still fall within the inventive concepts disclosed herein.

By way of further explanation, a first output section includes one or more first driving transistors (e.g., P1 and N1) coupled to a first differential output terminal (Out+), the one or more first driving transistors being configured to drive a first current $T_{Out+}$ through the first output section and not through the cross-coupled latch (N5 and N6). Similarly, a second output section includes one or more second driving transistors (e.g., P2 and N2) coupled to a second differential output terminal (Out−), the one or more second driving transistors being configured to drive a second current $T_{Out−}$ through the second output section and not through the cross-coupled latch (N5 and N6). Thus, the write driver Writer B is divided into two stages, or in other words, the driven currents are isolated from the latch circuit.

Notably, no two PMOS type transistors are serially connected in the write driver Writer B, which significantly reduces the consumption of die area, as explained in further detail below.

The structural details of the first and second output sections of the write driver circuit of Writer B of FIG. 9A are similar to the first and second output sections of the write driver circuit of Writer A with reference to FIG. 8, and therefore, a detailed description of these components is not repeated.

It should be noted, however, that there are other differences that should be highlighted. The cross-coupled latch includes a first NMOS type signal transistor N5 having a source coupled to the second voltage potential VSS, a drain coupled to the first node "On" that is coupled to gates of the driving transistors P1 and N1 of the first output section, and a gate coupled to the second node "Op" that is coupled to gates of the driving transistors P2 and N2 of the second output section. In addition, the cross-coupled latch includes a second NMOS type signal transistor N6 having a source coupled to the second voltage potential VSS, a drain coupled to the second node "Op," and a gate coupled to the first node "On."

The level shifting Writer B 405 of FIG. 9A further includes an input section including a first NMOS type signal transistor N7 coupled to the first differential input terminal In+, a second NMOS type signal transistor N8 coupled to the second differential input terminal In−, a first PMOS type signal transistor P5 coupled to the first differential input terminal In+, a second PMOS type signal transistor P6 coupled to the second differential input terminal In−, and a third NMOS type signal transistor N0. As shown in FIG. 9A, the transistor N0 is coupled to the transistors N7 and N8 of the input section. As shown in FIG. 9B, which is a logically equivalent circuit as that shown in FIG. 9A, the transistor N0 is coupled to the transistors N5 and N6. The transistor N0 is configured to receive the control signal WR. The nodes "Op" and "On" are both configured to have the first voltage potential VDD during the initial state. An input voltage of the first or second differential input terminals (In+ and/or In−) is substantially between the first voltage potential VDD and the ground potential GND, which is one half of a difference of the first voltage potential VDD and the second voltage potential VSS.

The transistor N0 and at least one of the transistors N7, N8, P5, or P6 of the input section are configured to pull one of the corresponding nodes "On" or "Op" from the first voltage potential VDD to the second voltage potential VSS responsive to the control signal WR. The cross-coupled latch is configured to latch respective voltage potentials (e.g., VDD or VSS) at the nodes "On" or "Op." The first output section is configured to drive the first differential output terminal Out+ to one of the first voltage potential VDD or the second voltage potential VSS responsive to the voltage potential at the node "On." The second output section is configured to drive the second differential output terminal Out− to the other of the first voltage potential VDD or the second voltage potential VSS responsive to the voltage potential at the node "Op."

FIG. 11 is an example size ratio comparison matrix 1010 between a typical write driver and write drivers in accordance with embodiments of the inventive concept. A value of 1 indicates a minimum suitable or otherwise viable size unit for a transistor given the state of transistor technology. A value greater than 1 indicates a larger transistor size relative to the underlying size unit of 1. For example, a value of 2 indicates double the size of the value of 1. Similarly, a value of 4 indicates quadruple the size of the value of 1. Thus, relative size ratios are provided to illustrate the differences between the various configurations, which impact the amount of die area used by each configuration.

The asterisk indicator '*' indicates a reason for the increased size, specifically, that the transistor is four times bigger due to having an input voltage level that is half the gate drive voltage. The carrot indicator '^' indicates a reason for the decreased size, specifically, that there is a non-stacked PMOS configuration, or in other words, that no two PMOS transistors are serially connected in the particular configuration.

Figure 1B:
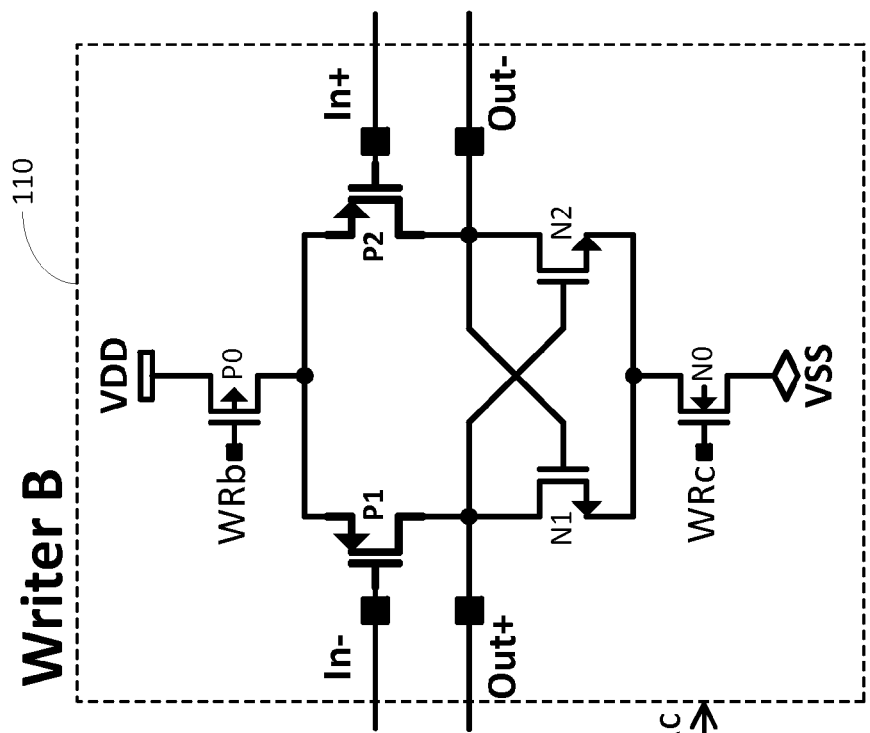
FIGS. 1A-1B are circuit diagrams of a write driver in a sense amplifier according to the prior art.
Figure 1A:
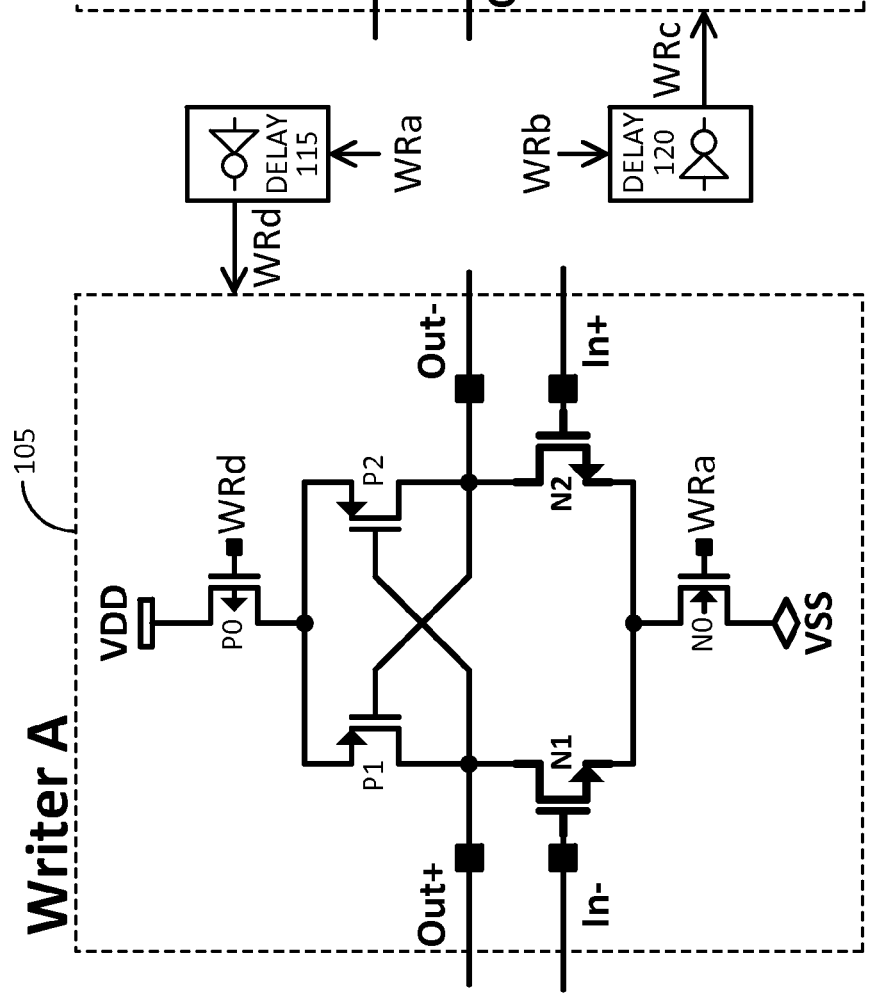

As shown in the matrix 1010, the typical configuration illustrated in FIGS. 1A and 1B above has the worse characteristics in terms of relative size or amount of die space consumed by the transistors of Writer A and Writer B. Specifically, Writer A of FIG. 1A consumes a relative size or amount of 30 and Writer B of FIG. 1B consumes a relative size or amount of 42. The latched configuration illustrated in FIGS. 6A and 6B have good characteristics in terms of relative size consumed by the transistors of Writer A and Writer B. Specifically, Writer A of FIG. 6A consumes a relative size or amount of 23 and Writer B of FIG. 6B consumes a relative size or amount of 23. The two stage configuration illustrated in FIGS. 8, 9A and 9B have better characteristics in terms of relative size consumed by the transistors of Writer A and Writer B. Specifically, Writer A of FIG. 8 consumes a relative size or amount of 19 and Writer B of FIGS. 9A and 9B consumes a relative size or amount of 21.

Moreover, while the typical and latched configurations use two control logic signals and have associated delay logic, the two stage implementation of FIGS. 8, 9A and 9B use a single control logic signal and need not have the additional delay logic.

Figure 12:
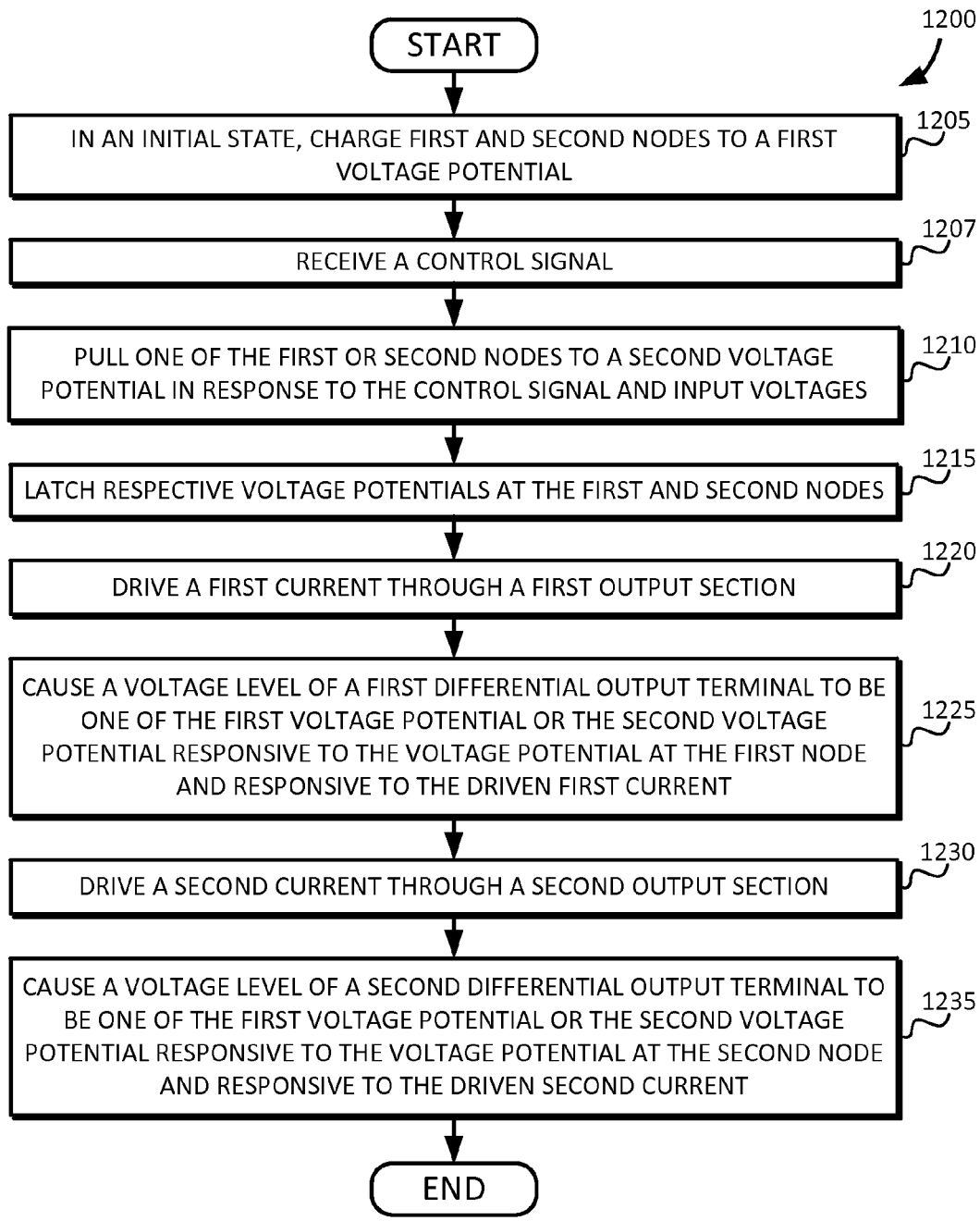
FIG. 12 is a flow diagram illustrating a technique for level shifting voltages in a write driver of a sense amplifier circuit in accordance with embodiments of the inventive concept.

FIG. 12 is a flow diagram 1200 illustrating a technique for level shifting voltages in a write driver of a sense amplifier circuit in accordance with embodiments of the inventive concept. The technique begins at 1205, where in an initial state, first and second nodes are charged to a first voltage potential. At 1207, the write driver receives a control signal. At 1210, one of the first or second nodes is pulled to a second voltage potential in response to the control signal and input voltages. At 1215, respective voltage potentials are latched at the first and second nodes.

The technique proceeds to 1220, where a first current is driven through a first output section, which causes at 1225 a voltage level of a first differential output terminal to be one of the first voltage potential or the second voltage potential responsive to the voltage potential at the first node and responsive to the driven first current. In the meanwhile, at 1230, a second current is driven through a second output section, which causes at 1235 a voltage level of a second differential output terminal to be one of the first voltage potential or the second voltage potential responsive to the voltage potential at the second node and responsive to the driven second current.

Figure 13:
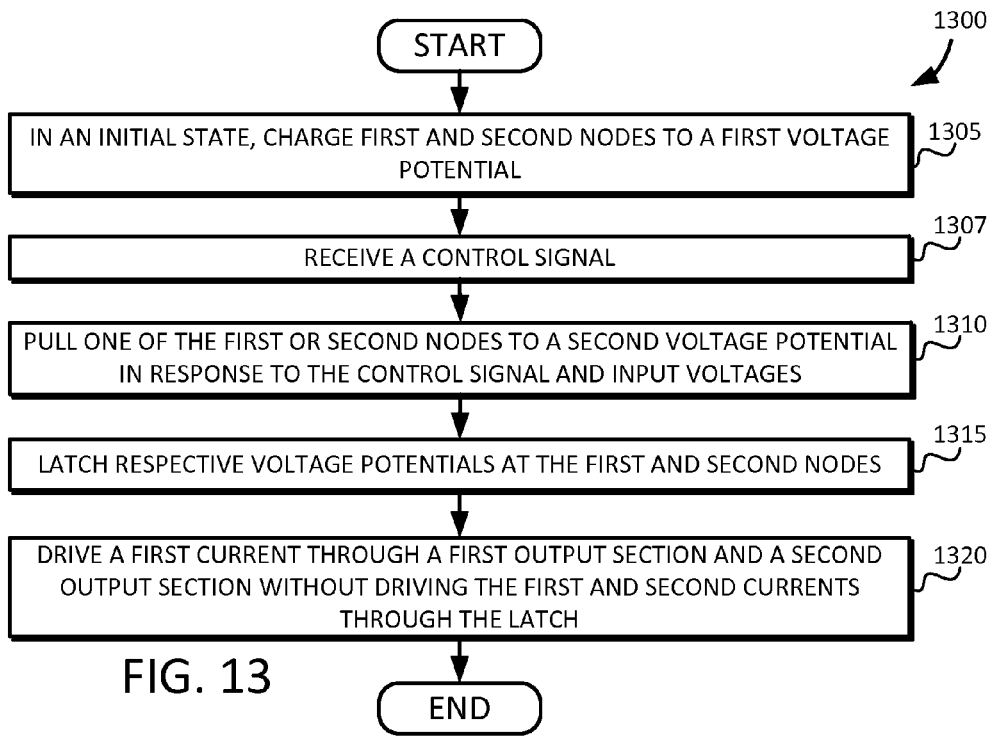
FIG. 13 is a flow diagram illustrating a technique for isolating current flows in a write driver of a sense amplifier circuit in accordance with embodiments of the inventive concept.

FIG. 13 is a flow diagram 1300 illustrating a technique for isolating current flows in a write driver of a sense amplifier circuit in accordance with embodiments of the inventive concept. The technique begins at 1305, where in an initial state, first and second nodes are charged to a first voltage potential. At 1307, the write driver receives a control signal. At 1310, one of the first or second nodes is pulled to a second voltage potential in response to the control signal and input voltages. Respective voltage potentials are latched by a latch circuit at the first and second nodes at 1315. At 1320, a first current is driven through a first output section and a second current is driven through a second output section without driving the first and second currents through the latch circuit.

Figure 14:
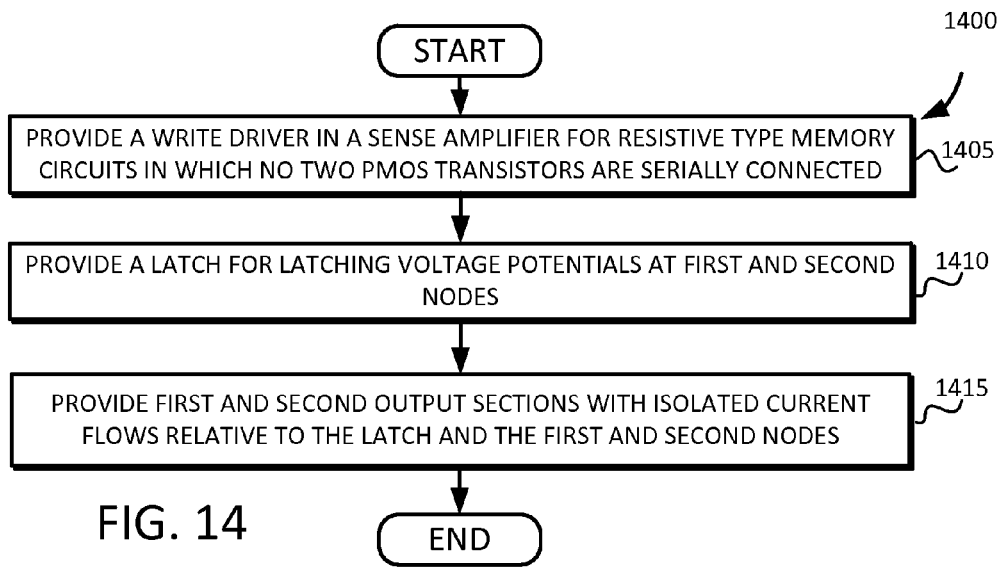
FIG. 14 is a flow diagram illustrating a technique for providing a write driver in a sense amplifier in which no two PMOS type transistors are serially connected in accordance with embodiments of the inventive concept.

FIG. 14 is a flow diagram 1400 illustrating a technique for providing a write driver in a sense amplifier in which no two PMOS type transistors are serially connected in accordance with embodiments of the inventive concept. The technique begins at 1405, where a write driver is provided in a sense amplifier for resistive type memory circuits in which no two PMOS type transistors are serially connected, thereby reducing the consumption of die area. At 1410, a latch is provided for latching voltage potentials at first and second nodes. At 1415, first and second output sections are provided with isolated current flows relative to the latch and relative to the first and second nodes.

Referring to FIGS. 4, 6A, 6B, 8, 9A, and 9B described above, in some embodiments, the source lines SLs are tied to a ground GND potential, and this is the configuration that is assumed for the circuit diagram illustrated in these Figures. It will be understood, however, that in some embodiments (for any of the circuit diagrams described with reference to FIGS. 4, 6A, 6B, 8, 9A, and 9B), the source lines SLs can be tied to a power supply potential VDD, and the regular VDD potential can be tied to the ground GND potential. In such case, each PMOS type transistor is replaced with an NMOS type transistor, and each NMOS type transistor is replaced with a PMOS type transistor. In other words, where the source lines SLs are tied to the VDD potential, the sense amplifier is swapped between the upside and the downside, which means that the NMOS type transistors are replaced with PMOS type transistors, and the PMOS type transistors are replaced with NMOS type transistors. Put differently, when the source line is coupled to the ground voltage, the sense amplifier circuit includes a first transistor configuration, and when the source line is coupled to the power supply voltage, the sense amplifier circuit includes a second transistor configuration that is swapped relative to the first transistor configuration. It will also be understood that in some embodiments, the source lines SLs can remain tied to the ground GND potential, the negative power supply voltage node VSS can be replaced with the positive power supply voltage node VDD, the regular VDD potential can be tied to the ground GND potential, and the NMOS and PMOS type transistors can be swapped as described above.

Figure 15:
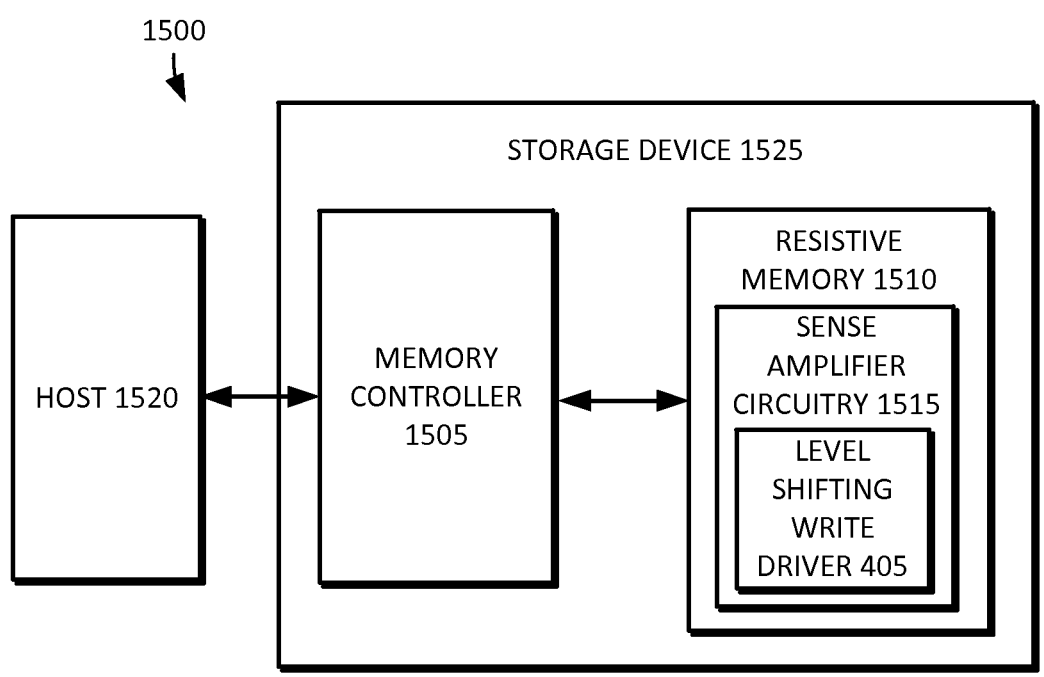
FIG. 15 is a block diagram schematically illustrating various applications of a resistive memory device, according to an embodiment of the inventive concept.

FIG. 15 is a block diagram schematically illustrating various applications of a resistive memory device, according to an embodiment of the inventive concept. Referring to FIG. 15, a memory system 1500 may include a storage device 1525 and a host 1520. The storage device 1525 may include a resistive memory 1510 and a memory controller 1505.

The storage device 1525 may include a storage medium such as a memory card (e.g., SD, MMC, etc.) or an attachable handheld storage device (e.g., USB memory, etc.). The storage device 1525 may be connected to the host 1520. The storage device 1525 may transmit and receive data to and from the host 1520 via a host interface. The storage device 1525 may be powered by the host 1520 to execute an internal operation. The resistive memory 1510 may include sense amplifier circuitry 1515 having one or more level shift write drivers 405 according to an embodiment of the inventive concept.

Figure 16:
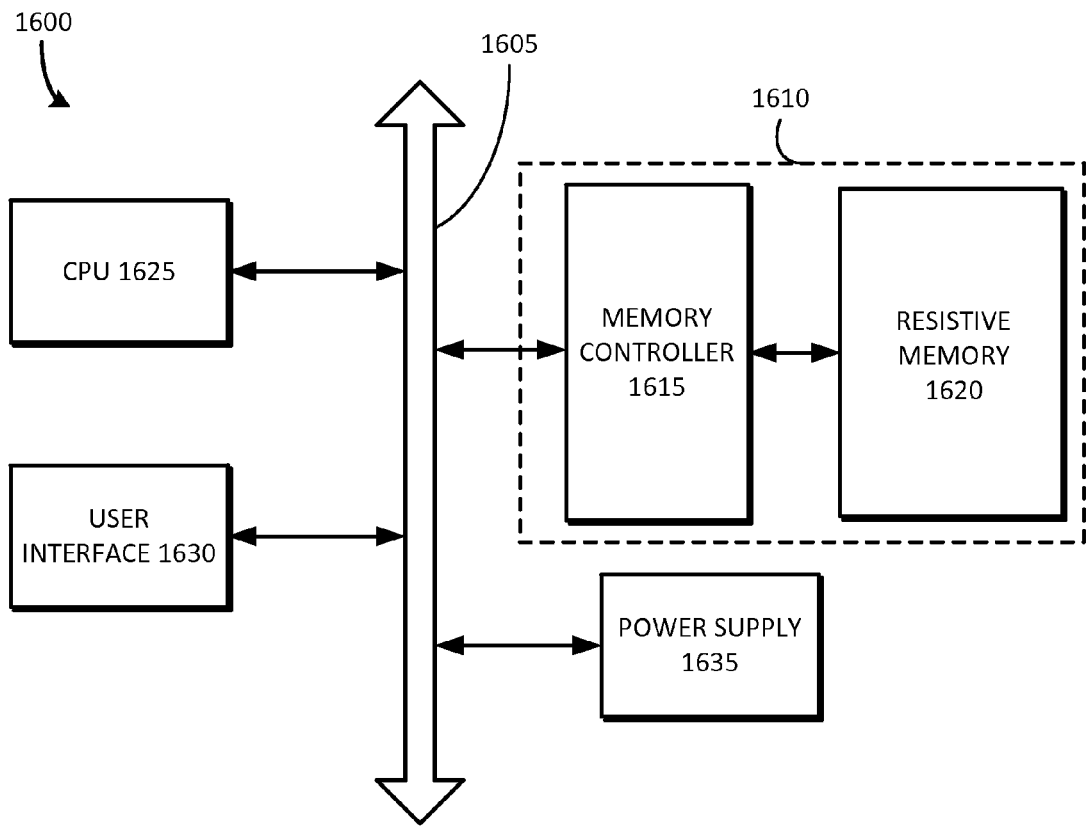
FIG. 16 is a block diagram of a computing system, including a resistive memory device, according to an embodiment of the inventive concept.

FIG. 16 is a block diagram of a computing system 1600, including a resistive memory device, according to an embodiment of the inventive concept. Referring to FIG. 16, the computing system 1600 includes a memory system 1610, a power supply 1635, a central processing unit (CPU) 1625, and a user interface 1630. The memory system 1610 includes a resistive memory device 1620 and a memory controller 1615. The CPU 1625 is electrically connected to a system bus 1605.

The resistive memory device 1620 may include sense amplifier circuitry according to an embodiment of the inventive concept. The resistive memory device 1620 stores data through the memory controller 1615. The data is received from the user interface 1630 or processed by the CPU 1625. The memory system 1600 may be used as a semiconductor disc device (SSD).

Figure 17:
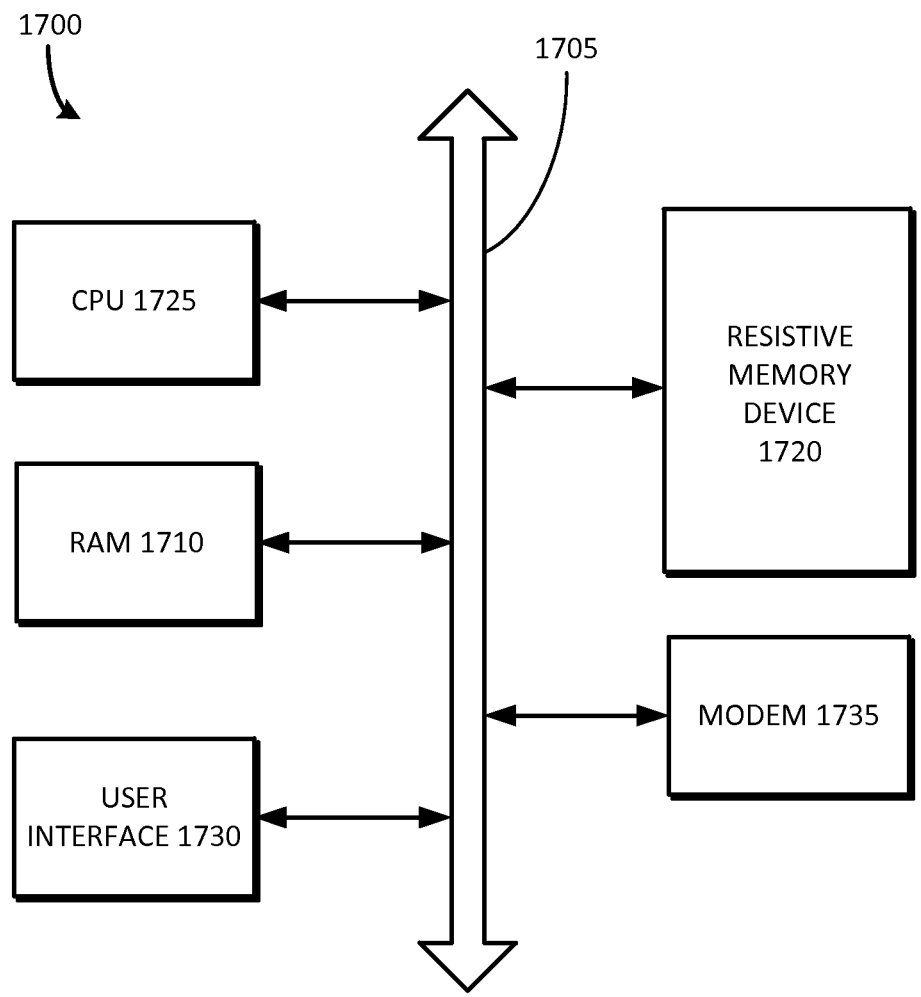
FIG. 17 is a block diagram schematically illustrating a computing system, including a resistive memory device, according to an embodiment of the inventive concept.

FIG. 17 is a block diagram schematically illustrating a computing system 1700, including a resistive memory device, according to an embodiment of the inventive concept. Referring to FIG. 17, the computing system 1700 may include a resistive memory device 1720, a CPU 1725, a RAM 1710, a user interface 1730, and a modem 1735 such as a baseband chipset, which are electrically connected to a system bus 1705. The resistive memory device 1720, as described above, may include sense amplifier circuitry according to an embodiment of the inventive concept.

If the computing system 1700 is a mobile device, it may further include a battery (not shown) which powers the computing system 1700. Although not shown in FIG. 17, the computing system 1700 may further include an application chipset, a camera image processor (CIS), a mobile DRAM, and the like.

A resistive memory device according to an embodiment of the inventive concept may be used as a storage class memory (SCM). The "storage class memory" may be the generic term for a memory which provides both the nonvolatile characteristic and random-access characteristic.

The above described PRAM, FeRAM, MRAM, and the like as well as the resistive memory (ReRAM) may be used as the storage class memory. Instead of a flash memory, the storage class memory may be used as a data storage memory. Further, instead of a synchronous DRAM, the storage class memory may be used as a main memory. Further, one storage class memory may be used instead of a flash memory and a synchronous DRAM.

Figure 18:
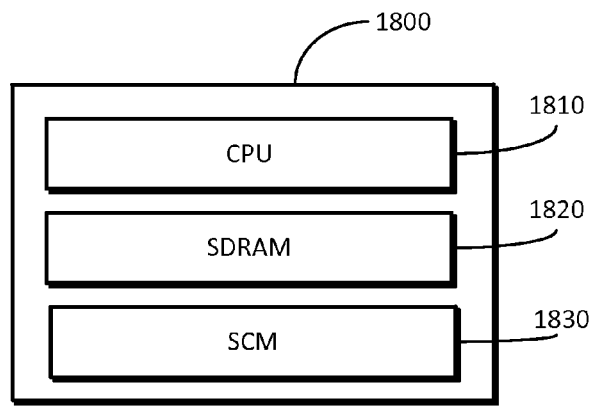
FIG. 18 is a block diagram schematically illustrating a memory system in which a flash memory is replaced with a storage class memory using a resistive memory, according to an embodiment of the inventive concept.

FIG. 18 is a block diagram schematically illustrating a memory system in which a flash memory is replaced with a storage class memory using a resistive memory, according to an embodiment of the inventive concept. Referring to FIG. 18, a memory system 1800 may include a CPU 1810, a synchronous DRAM (SDRAM) 1820, and a storage class memory (SCM) 1830. The SCM 1830 may be a resistive memory that is used as a data storage memory instead of a flash memory.

The SCM 1830 may access data in higher speed compared with a flash memory. For example, in a PC in which the CPU 1810 operates at a frequency of 4 GHz, a resistive memory being a type of SCM 1830 may provide an access speed higher than a flash memory. Thus, the memory system 1800 including the SCM 1830 may provide a relatively higher access speed than a memory system including a flash memory.

Figure 19:
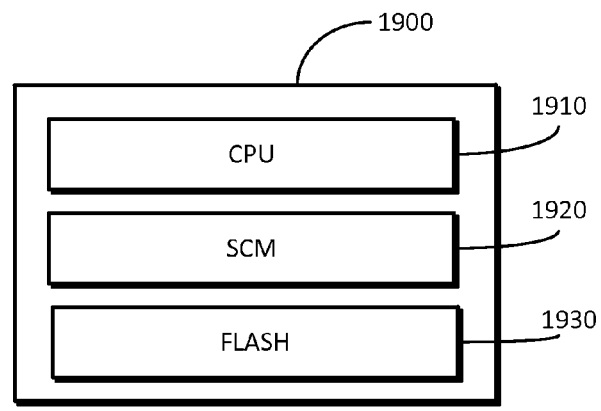
FIG. 19 is a block diagram schematically illustrating a memory system in which a synchronous DRAM is replaced with a storage class memory using a resistive memory, according to an embodiment of the inventive concept.

FIG. 19 is a block diagram schematically illustrating a memory system in which a synchronous DRAM is replaced with a storage class memory using a resistive memory, according to an embodiment of the inventive concept. Referring to FIG. 19, a memory system 1900 may include a CPU 1910, a storage class memory (SCM) 1920, and a flash memory 1930. The SCM 1920 may be used as a main memory instead of a synchronous DRAM (SDRAM).

Power consumed by the SCM 1920 may be less than that consumed by the SDRAM. A main memory may take about 40% of a power consumed by a computing system. For this reason, a technique of reducing power consumption of a main memory has been developed. Compared with the DRAM, the SCM 1920 may on average reduce 53% of dynamic energy consumption and about 73% of energy consumption due to power leak. Thus, the memory system 1900 including the SCM 1920 may reduce power consumption compared with a memory system including an SDRAM.

Figure 20:
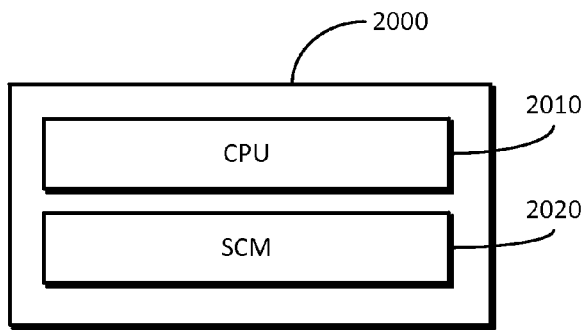
FIG. 20 is a block diagram schematically illustrating a memory system in which a synchronous DRAM and a flash memory are replaced with a storage class memory using a resistive memory according to an embodiment of the inventive concept.

FIG. 20 is a block diagram schematically illustrating a memory system in which a synchronous DRAM and a flash memory are replaced with a storage class memory using a resistive memory according to an embodiment of the inventive concept. Referring to FIG. 20, a memory system 2000 may include a CPU 2010 and a storage class memory (SCM) 2020. The SCM 2020 may be used as a main memory instead of a synchronous DRAM (SDRAM) and as a data storage memory instead of a flash memory. The memory system 2000 may be advantageous in the light of data access speed, low power, cost, and use of space.

A resistive memory device according to the inventive concept may be packed by at least one selected from various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

A resistive memory device according to an embodiment of the inventive concept may be applied to various products. The resistive memory device according to an embodiment of the inventive concept may be applied to storage devices such as a memory card, a USB memory, a solid state drive (SSD), and the like, as well as to electronic devices such as a personal computer, a digital camera, a camcorder, a cellular phone, an MP3 player, a PMP, a PSP, a PDA, and the like.

The example embodiments disclosed herein provide a sense amplifier circuit capable of using a lower power supply voltage. In addition, the sense amplifier circuit embodiments disclosed herein provide faster read response times, less sensitivity on the parasitic difference between bit lines and reference lines, strong noise immunity by keeping signal average, and additional configurations using self-latching logic. It will be understood that different features from different embodiments can be combined in the same sense amplifier circuit.

The above embodiments of the inventive concept are illustrative and not limitative. Various alternatives and equivalents are possible. The embodiments of the inventive concept are not limited by the type or the number of the magnetic random access memory cells included in a memory array. The embodiments of the inventive concept are not limited by the type of transistor, PMOS, NMOS or otherwise, included to operate the sense amplifier circuit, select a magnetic tunnel junction device, or the like. The embodiments of the inventive concept are not limited by the type of logic gates, NOR or NAND included to implement logical column selection or to produce control logic for the sense amplifier circuit. The embodiments of the inventive concept are not limited by the type of integrated circuit in which the inventive concept may be disposed. Nor are the embodiments of the inventive concept limited to any specific type of process technology, e.g., CMOS, Bipolar, or BICMOS that may be included to manufacture a memory. The embodiments described herein have been directed to sense amplifier circuits but are not limited thereto. The embodiments described herein may be included wherever improving response times, noise immunity characteristics, low voltage operation capabilities, larger voltage headroom features, or fewer sense errors, or the like, may be found useful.

Other similar or non-similar modifications can be made without deviating from the intended scope of the inventive concept. Accordingly, the inventive concept is not limited except as by the appended claims.

What is claimed is:

1. A write driver in a sense amplifier for a resistive type memory, comprising:
   a cross-coupled latch including at least two latch transistors;
   a first output section including one or more first driving transistors coupled to a first differential output terminal, the one or more first driving transistors being configured to drive a first current through the first output section and not through the cross-coupled latch; and
   a second output section including one or more second driving transistors coupled to a second differential output terminal, the one or more second driving transistors being configured to drive a second current through the second output section and not through the cross-coupled latch
   wherein the first output section comprises:
   a PMOS type driving transistor from among the one or more first driving transistors, the PMOS type driving transistor being coupled to a first voltage potential and to the first differential output terminal;

an NMOS type driving transistor from among the one or more first driving transistors, the NMOS type driving transistor being coupled to the first differential output terminal and to a second voltage potential;

wherein the second output section comprises:
a PMOS type driving transistor from among the one or more second driving transistors, the PMOS type driving transistor being coupled to the first voltage potential and to the second differential output terminal; and
an NMOS type driving transistor from among the one or more second driving transistors, the NMOS type driving transistor being coupled to the second differential output terminal and to the second voltage potential.

2. The write driver of claim 1, wherein no two PMOS type transistors are serially connected.

3. The write driver of claim 1, wherein the NMOS type driving transistor from among the one or more first driving transistors is referred to as a first NMOS type driving transistor from among the one or more first driving transistors, and wherein the first output section further comprises:
a first signal transistor coupled to a gate of the PMOS type driving transistor from among the one or more first driving transistors, to a gate of the first NMOS type driving transistor from among the one or more first driving transistors, and to the first voltage potential; and
a second NMOS type driving transistor from among the one or more first driving transistors, the second NMOS type driving transistor from among the one or more first driving transistors being coupled to the first NMOS type driving transistor from among the one or more first driving transistors and to the second voltage potential,
wherein a gate of the first signal transistor is coupled to a control signal, and a gate of the second NMOS type driving transistor from among the one or more first driving transistors is coupled to the control signal.

4. The write driver of claim 1, wherein the NMOS type driving transistor from among the one or more second driving transistors is referred to as a first NMOS type driving transistor from among the one or more second driving transistors, and wherein the second output section further comprises:
a second signal transistor coupled to a gate of the PMOS type driving transistor from among the one or more second driving transistors, to a gate of the first NMOS type driving transistor from among the one or more second driving transistors, and to the first voltage potential; and
a second NMOS type driving transistor from among the one or more second driving transistors, the second NMOS type driving transistor from among the one or more second driving transistors being coupled to the first NMOS type driving transistor from among the one or more second driving transistors and to the second voltage potential,
wherein a gate of the second signal transistor is coupled to a control signal, and a gate of the second NMOS type driving transistor from among the one or more second driving transistors is coupled to the control signal.

5. The write driver of claim 1, wherein the cross-coupled latch further comprises:
a first PMOS type signal transistor from among the at least two latch transistors, the first PMOS type signal transistor having a source coupled to the first voltage potential, a drain coupled to a first node that is coupled to gates of the driving transistors of the first output section, and a gate coupled to a second node that is coupled to gates of the driving transistors of the second output section; and
a second PMOS type signal transistor from among the at least two latch transistors, the second PMOS type signal transistor having a source coupled to the first voltage potential, a drain coupled to the second node, and a gate coupled to the first node.

6. The write driver of claim 5, further comprising:
an input section including a first NMOS type signal transistor coupled to a first differential input terminal, a second NMOS type signal transistor coupled to a second differential input terminal, and a third NMOS type signal transistor coupled to the first and second NMOS type signal transistors of the input section.

7. The write driver of claim 6, wherein an input voltage of the first or second differential input terminals is substantially between the second voltage potential and one half of a difference of the first voltage potential and the second voltage potential.

8. The write driver of claim 6, wherein an input voltage of the first or second differential input terminals is substantially between the second voltage potential and the first voltage potential.

9. The write driver of claim 6, wherein the third NMOS type signal transistor is configured to receive a control signal.

10. The write driver of claim 9, wherein the first and second nodes are configured to have the first voltage potential during an initial state.

11. The write driver of claim 10, wherein:
the third NMOS type signal transistor and one of the first or second NMOS type signal transistors of the input section are configured to pull one of the corresponding first or second nodes from the first voltage potential to the second voltage potential responsive to the control signal;
the cross-coupled latch is configured to latch respective voltage potentials at the first and second nodes;
the first output section is configured to drive the first differential output terminal to one of the first voltage potential or the second voltage potential responsive to the voltage potential at the first node; and
the second output section is configured to drive the second differential output terminal to the other of the first voltage potential or the second voltage potential responsive to the voltage potential at the second node.

12. The write driver of claim 1, wherein the cross-coupled latch further comprises:
a first NMOS type signal transistor from among the at least two latch transistors, the first NMOS type signal transistor having a source coupled to the second voltage potential, a drain coupled to a first node that is coupled to gates of the driving transistors of the first output section, and a gate coupled to a second node that is coupled to gates of the driving transistors of the second output section; and
a second NMOS type signal transistor from among the at least two latch transistors, the second NMOS type signal transistor having a source coupled to the second voltage potential, a drain coupled to the second node, and a gate coupled to the first node.

13. The write driver of claim 12, further comprising:
an input section including a first NMOS type signal transistor coupled to a first differential input terminal, a second NMOS type signal transistor coupled to a second differential input terminal, a first PMOS type signal transistor coupled to the first differential input terminal, a second PMOS type signal transistor coupled to the second differential input terminal, and a third NMOS type signal transistor.

14. The write driver of claim 13, wherein the third NMOS type signal transistor is coupled to the first and second NMOS type signal transistors of the input section.

15. The write driver of claim 13, wherein the third NMOS type signal transistor is coupled to the first and second NMOS type signal transistors of the cross-coupled latch.

16. The write driver of claim 13, wherein an input voltage of the first or second differential input terminals is substantially between the first voltage potential and one half of a difference of the first voltage potential and the second voltage potential.

17. A method for sensing and driving signals associated with a write driver in a sense amplifier for resistive type memory, the method comprising:
  in an initial state, charging first and second nodes of the write driver to a first voltage potential;
  receiving a control signal;
  pulling one of the first or second nodes from the first voltage potential to a second voltage potential responsive to the control signal and responsive to voltage levels of first or second differential input terminals, respectively;
  latching, by a latch circuit, the respective voltage potentials at the first and second nodes;
  driving, by a PMOS type driving transistor from among one or more first driving transistors, a first current through a first output section and not through the latch circuit;
  causing a voltage level of a first differential output terminal to be one of the first voltage potential or the second voltage potential responsive to the voltage potential at the first node and responsive to the driven first current;
  driving, by an NMOS type driving transistor from among one or more second driving transistors, a second current through a second output section and not through the latch circuit; and
  causing a voltage level of a second differential output terminal to be the other of the first voltage potential or the second voltage potential responsive to the voltage potential at the second node and responsive to the driven second current.

18. The method of claim 17, further comprising providing the write driver in which no two PMOS type transistors are serially connected, wherein:
  driving the first current includes not driving the first current through the latch circuit; and
  driving the second current includes not driving the second current through the latch circuit.

* * * * *